(12) United States Patent
Han et al.

(10) Patent No.: US 11,538,533 B2
(45) Date of Patent: Dec. 27, 2022

(54) NON-VOLATILE MEMORY DEVICE WHICH UTILIZES A PULSE APPLIED TO A BIT LINE AND/OR A COMMON SOURCE LINE BETWEEN READ OPERATIONS TO REDUCE NOISE

(71) Applicant: SAMSUNG ELECTRONICS CO., LTD., Suwon-si (KR)

(72) Inventors: Gu Yeon Han, Suwon-si (KR); Jin-Kyu Kang, Seoul (KR); Rae Young Lee, Suwon-si (KR); Se Jun Park, Yongin-si (KR); Jae Duk Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/233,858

(22) Filed: Apr. 19, 2021

(65) Prior Publication Data
US 2022/0076727 A1 Mar. 10, 2022

(30) Foreign Application Priority Data
Sep. 7, 2020 (KR) .......................... 10-2020-0113887

(51) Int. Cl.
*G11C 7/12* (2006.01)
*G11C 16/26* (2006.01)
(Continued)

(52) U.S. Cl.
CPC .......... *G11C 16/26* (2013.01); *G11C 16/0483* (2013.01); *G11C 16/24* (2013.01);
(Continued)

(58) Field of Classification Search
CPC ..... G11C 16/0483; G11C 16/26; G11C 16/24; G11C 16/3418
See application file for complete search history.

(56) References Cited

U.S. PATENT DOCUMENTS

| 7,599,232 B2 | 10/2009 | Miyata |
| 8,203,885 B2 | 6/2012 | Abiko et al. |
| (Continued) | | |

OTHER PUBLICATIONS

European Search Report issued in corresponding European Patent Application No. EP 21 176 164.8 dated Nov. 11, 2021.
(Continued)

*Primary Examiner* — Mushfique Siddique
(74) *Attorney, Agent, or Firm* — F. Chau & Associates, LLC

(57) ABSTRACT

A non-volatile memory device including: a memory cell array including non-volatile memory blocks connected to a plurality of word lines, a plurality of bit lines and a common source line; a common source line driver configured to supply a common source line voltage to the common source line; a page buffer unit configured to supply a bit line voltage to at least one of the plurality of bit lines; a control logic circuit configured to adjust the common source line voltage and the bit line voltage; and a channel initialization circuit, wherein the channel initialization circuit sets the common source line voltage and the bit line voltage to an initialization pulse, and the channel initialization circuit applies the initialization pulse between a plurality of read sections in which a read voltage is applied to at least two of the plurality of word lines.

17 Claims, 17 Drawing Sheets

(51) Int. Cl.
   *G11C 16/34* (2006.01)
   *G11C 16/04* (2006.01)
   *G11C 16/30* (2006.01)
   *G11C 16/24* (2006.01)
   *G11C 16/32* (2006.01)

(52) U.S. Cl.
   CPC .......... *G11C 16/30* (2013.01); *G11C 16/3418* (2013.01); *G11C 16/3427* (2013.01); *G11C 16/32* (2013.01)

(56) References Cited

U.S. PATENT DOCUMENTS

| | | |
|---|---|---|
| 8,427,879 B2 | 4/2013 | Chang et al. |
| 8,891,314 B2 | 11/2014 | Park |
| 8,988,937 B2 | 3/2015 | Dunga et al. |
| 8,988,939 B2 | 3/2015 | Dunga et al. |
| 9,401,210 B2 * | 7/2016 | Kwon ................ H01L 27/1157 |
| 9,728,266 B1 | 8/2017 | Goda et al. |
| 9,916,901 B1 | 3/2018 | Saito et al. |
| 2015/0003169 A1 | 1/2015 | Nam et al. |
| 2016/0260489 A1 | 9/2016 | Lee et al. |
| 2018/0211709 A1 * | 7/2018 | Kim ................... G11C 16/3459 |
| 2019/0267092 A1 | 8/2019 | Joe et al. |
| 2019/0318784 A1 * | 10/2019 | Lee ........................ G11C 16/10 |
| 2019/0333592 A1 | 10/2019 | Lee et al. |
| 2020/0020406 A1 | 1/2020 | Kim et al. |
| 2022/0020438 A1 * | 1/2022 | Seo ........................ G11C 16/10 |
| 2022/0036953 A1 * | 2/2022 | Joe ........................ G11C 16/30 |

OTHER PUBLICATIONS

European Office Action issued in corresponding European Patent Application No. EP 21 176 164.8 dated Nov. 23, 2021.

* cited by examiner

Noise Region 1

NON-VOLATILE MEMORY DEVICE WHICH UTILIZES A PULSE APPLIED TO A BIT LINE AND/OR A COMMON SOURCE LINE BETWEEN READ OPERATIONS TO REDUCE NOISE

This application claims priority under 35 U.S.C. § 119 to Korean Patent Application No. 10-2020-0113887 filed on Sep. 7, 2020 in the Korean Intellectual Property Office, the disclosure of which is incorporated by reference herein in its entirety.

1. TECHNICAL FIELD

The present disclosure relates to a non-volatile memory device. More specifically, the present disclosure relates to a non-volatile memory device which utilizes a Gate Induced Drain Leakage (GIDL) phenomenon generated through a pulse applied to a bit line and/or a common source line.

2. DISCUSSION OF THE RELATED ART

A semiconductor memory device may be classified as a volatile semiconductor memory device and a non-volatile semiconductor memory device. The volatile semiconductor memory device may lose stored data when power is lost. The non-volatile semiconductor memory device may store data in the absence of power. The data stored in the non-volatile memory may be permanent or reprogrammable. As a consequence, the non-volatile semiconductor memory device is used to store user data, program and microcode in a wide range of applications such as computer, avionics, communication, and consumer electronics technologies.

SUMMARY

According to an embodiment of the present disclosure, there is provided a non-volatile memory device including: a memory cell array including non-volatile memory blocks connected to a plurality of word lines, a plurality of bit lines and a common source line; a common source line driver configured to supply a common source line voltage to the common source line; a page buffer unit configured to supply a bit line voltage to at least one of the plurality of bit lines; a control logic circuit configured to adjust the common source line voltage and the bit line voltage; and a channel initialization circuit, wherein the channel initialization circuit sets the common source line voltage and the bit line voltage to an initialization pulse, and the channel initialization circuit applies the initialization pulse between a plurality of read sections in which a read voltage is applied to at least two of the plurality of word lines.

According to an embodiment of the present disclosure, there is provided a non-volatile memory device including: a memory cell array including non-volatile memory blocks connected to a plurality of word lines, a plurality of bit lines and a common source line; a control logic circuit configured to adjust a voltage applied to the plurality of word lines; and a channel initialization circuit configured to adjust a voltage applied to the plurality of bit lines and the common source line, wherein the control logic circuit applies a pre-charge voltage to the word lines, on which a read operation is executed, among the plurality of word lines from a first time to a second time, applies a read voltage to the word lines on which the read operation is executed from the second time to a third time, applies the read voltage to the word lines, on which no read operation is executed, among the plurality of word lines from the first time to the third time, and executes a recovery operation on the plurality of word lines from the third time to a fourth time, and the channel initialization circuit applies an initialization pulse to at least one of the plurality of bit lines and the common source line during at least a period of time between the third time and the fourth time.

According to an embodiment of the present disclosure, there is provided a non-volatile memory device including: a memory cell array including non-volatile memory blocks connected to a plurality of word lines, a plurality of string selection lines, a plurality of ground selection lines, a plurality of bit lines and a common source line; a row decoder connected to the plurality of word lines, the plurality of string selection lines and the plurality of ground selection lines; a common source line driver connected to the common source line; a voltage generator configured to apply a word line voltage to the row decoder; a page buffer unit connected to the plurality of bit lines; and a control logic circuit configured to transfer a voltage control signal for adjusting the word line voltage to the voltage generator, transfer a row address signal including word line information, which identifies the word line to which the word line voltage is applied, to the row decoder, transfer a common source line voltage control signal, which is used to control a common source line voltage applied to the common source line, to the common source line driver, transfer a read voltage to be applied to at least two of the plurality of word lines, and transfer a column address signal including bit line information, which identifies the bit line to which a bit line voltage is to be applied, to the page buffer unit, wherein the control logic circuit includes a channel initialization circuit, the channel initialization circuit sets the common source line voltage and the bit line voltage to an initialization pulse, and the channel initialization circuit applies the initialization pulse between a plurality of read sections at which the read voltage is applied to the at least two word lines.

According to an embodiment of the present disclosure, there is provided a non-volatile memory device including: a memory cell array including non-volatile memory blocks connected to a plurality of word lines, a plurality of bit lines and a common source line; a common source line driving circuit configured to supply a common source line voltage to the common source line; a page buffer circuit configured to supply a bit line voltage to at least one of the bit lines; and a channel initialization circuit configured to increase the common source line voltage and the bit line voltage to an initialization voltage level, wherein the initialization voltage level is reached between a first read section and a second read section, wherein a read voltage is applied to a selected word line and an unselected wordline in each of the first and second read sections.

DETAILED DESCRIPTION OF THE EMBODIMENTS

Figure 1:
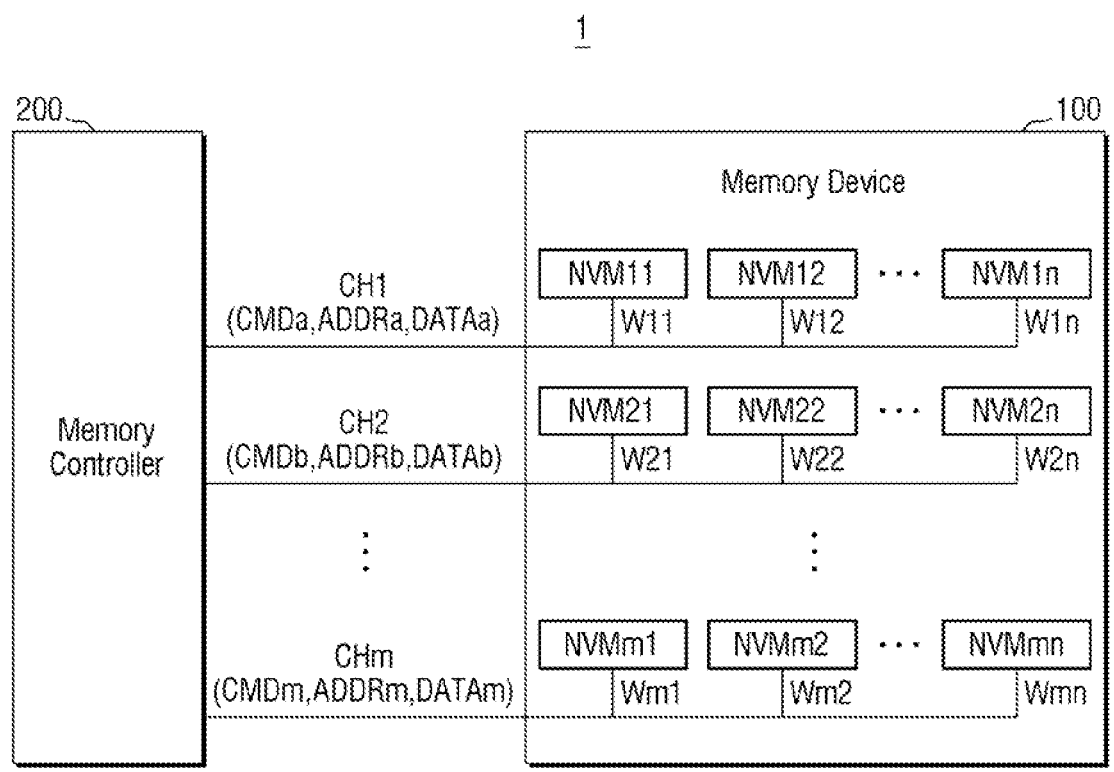
FIG. 1 is a block diagram showing a system including a non-volatile memory device according to some embodiments of the present disclosure.

FIG. 1 is a block diagram showing a system including a non-volatile memory device according to some embodiments of the present disclosure.

Referring to FIG. 1, a memory system 1 may include a memory device 100 and a memory controller 200. The memory system 1 may support a plurality of channels CH1 to CHm, and the memory device 100 and the memory controller 200 may be connected through the plurality of channels CH1 to CHm. For example, the memory system 1 may be implemented as a storage device such as a Solid State Drive (SSD).

The memory device 100 may include a plurality of non-volatile memory devices NVM11 to NVMmn according to some embodiments of the present disclosure. Each of the non-volatile memory devices NVM11 to NVMmn may be connected to one of the plurality of channels CH1 to CHm through a corresponding way. For example, the non-volatile memory devices NVM11 to NVM1n are connected to the first channel CH1 through ways W11 to W1n, and the non-volatile memory devices NVM21 to NVM2n may be connected to the second channel CH2 through ways W21 to W2n. In addition, the non-volatile memory devices NVMm1 to NVMmn may be connected to the m-th channel CHm through ways Wm1 to Wmn. In an exemplary embodiment of the present disclosure, each of the non-volatile memory devices NVM11 to NVMmn may be implemented in any memory unit that may operate according to individual commands from the memory controller 200. For example, although each of the non-volatile memory devices NVM11 to NVMmn may be implemented as a chip or die, the present disclosure is not limited thereto.

The memory controller 200 may send and receive signals to and from the memory device 100 through the plurality of channels CH1 to CHm. For example, the memory controller 200 may send commands CMDa to CMDm, addresses ADDRa to ADDRm, and data DATAa to DATAm to the memory device 100 through the channels CH1 to CHm, or may receive the data DATAa to DATAm from the memory device 100.

The memory controller 200 selects one of the non-volatile memory devices according to some embodiments of the present disclosure connected to that channel through each channel, and may send and receive signals to and from the selected non-volatile memory device. For example, the memory controller 200 may select a non-volatile memory device NVM11 among the non-volatile memory devices NVM11 to NVM1n connected to the first channel CH1. The memory controller 200 may send the command CMDa, the address ADDRa, and the data DATAa to the selected non-volatile memory device NVM11 through the first channel CH1, or may receive the data DATAa from the selected non-volatile memory device NVM11.

The memory controller 200 may send and receive signals in parallel to and from the memory device 100 through different channels. For example, while the memory controller 200 sends the command CMDa to the memory device 100 through the first channel CH1, the memory controller 200 may send the command CMDb to the memory device 100 through the second channel CH2. For example, while the memory controller 200 receives the data DATAa from the memory device 100 through the first channel CH1, the memory controller 200 may receive the data DATAb from the memory device 100 through the second channel CH2.

The memory controller 200 may control the overall operation of the memory device 100. The memory controller 200 may send signals to the channels CH1 to CHm to control each of the non-volatile memory devices NVM11 to NVMmn connected to the channels CH1 to CHm. For example, the memory controller 200 may send the command CMDa and the address ADDRa to the first channel CH1 to control the selected one of the non-volatile memory devices NVM11 to NVM1n.

Each of the non-volatile memory devices NVM11 to NVMmn may operate under the control of the memory controller 200. For example, the non-volatile memory device NVM11 may program the data DATAa according to the command CMDa, the address ADDRa, and the data DATAa provided to the first channel CH1. For example, the non-volatile memory device NVM21 may read the data DATAb according to the command CMDb and the address ADDRb provided to the second channel CH2, and may send the read data DATAb to the memory controller 200.

Although FIG. 1 shows a configuration in which the memory device 100 communicates with the memory controller 200 through m channels and the memory device 100 includes n non-volatile memory devices to correspond to each channel, the number of channels and the number of non-volatile memory devices connected to one channel may be variously changed.

Figure 2:
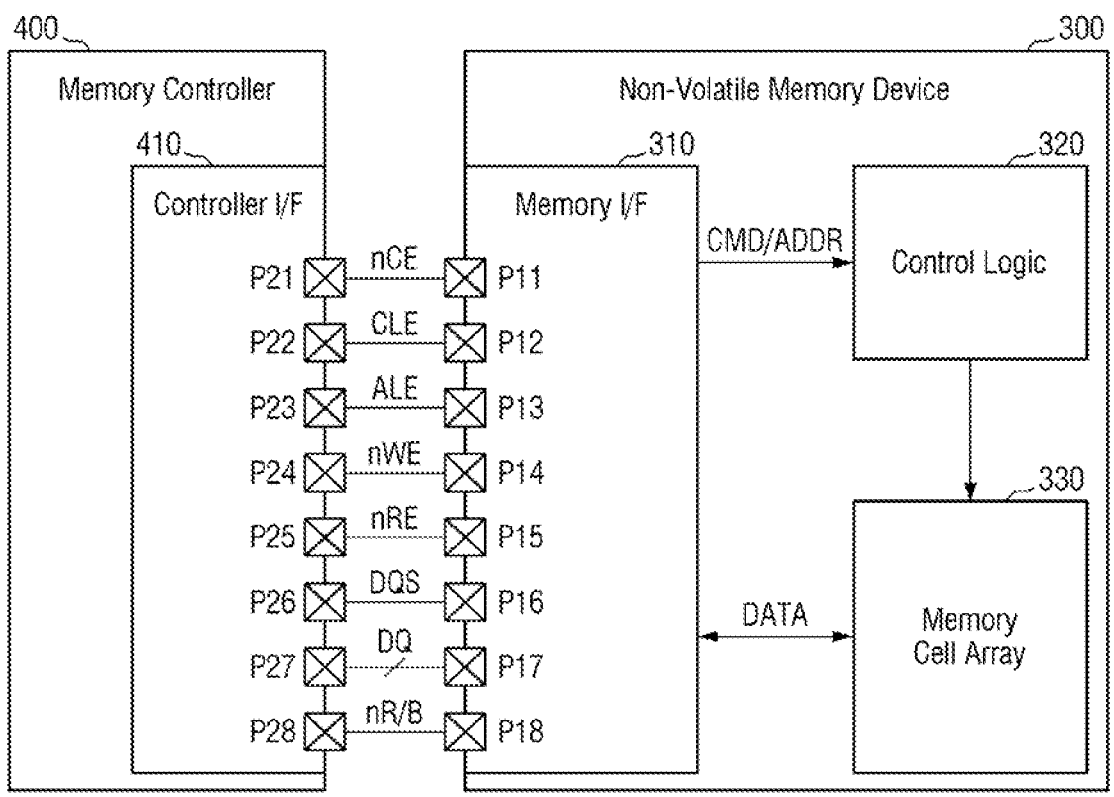
FIG. 2 is a block diagram showing another system including a non-volatile memory device according to some embodiments of the present disclosure.

FIG. 2 is a block diagram showing another system including a non-volatile memory device according to some embodiments of the present disclosure.

Referring to FIG. 2, a memory system 2 may include a non-volatile memory device 300 and a memory controller 400. The non-volatile memory device 300 may correspond to one of the non-volatile memory devices NVM11 to NVMmn of FIG. 1 that communicate with the memory controller 200 of FIG. 1 on the basis of one of the plurality of channels CH1 to CHm of FIG. 1. The memory controller 400 may correspond to the memory controller 200 of FIG. 1.

The memory device 300 may include first to eighth pins P11 to P18, a memory interface circuit 310, a control logic circuit 320, and a memory cell array 330.

The memory interface circuit 310 may receive a chip enable signal nCE from the memory controller 400 through a first pin P11. The memory interface circuit 310 may send and receive signals to and from the memory controller 400 through the second to eighth pins P12 to P18 according to the chip enable signal nCE. For example, when the chip enable signal nCE is in an enable state (e.g., a high level), the memory interface circuit 310 may send and receive signals to and from the memory controller 400 through the second to eighth pins P12 to P18.

The memory interface circuit 310 may receive a command latch enable signal CLE, an address latch enable signal ALE, and a write enable signal nWE from the memory controller 400 through the second to fourth pins P12 to P14. The memory interface circuit 310 may receive a data signal DQ from the memory controller 400 or send the data signal DQ to the memory controller 400 through a seventh pin P17. The command CMD, the address ADDR, and the data DATA may be transferred through the data signal DQ. For example, the data signal DQ may be transferred through a plurality of data signal lines. In this case, the seventh pin P17 may include a plurality of pins corresponding to the plurality of data signals.

The memory interface circuit 310 may acquire the command CMD from the data signal DQ received in an enable section (e.g., a high level state) of the command latch enable signal CLE on the basis of toggle timings of the write enable signal nWE. The memory interface circuit 310 may acquire an address ADDR from the data signal DQ received in the enable section (e.g., a high level state) of the address latch enable signal ALE on the basis of the toggle timings of the write enable signal nWE.

In an exemplary embodiment of the present disclosure, the write enable signal nWE may maintain a static state (e.g., a high level or a low level), and then, may toggle between the high level and the low level. For example, the write enable signal nWE may toggle in a section at which the command CMD or the address ADDR is sent. This allows the memory interface circuit 310 to acquire the command CMD or the address ADDR on the basis of the toggle timings of the write enable signal nWE.

The memory interface circuit 310 may receive the read enable signal nRE from the memory controller 400 through the fifth pin P15. The memory interface circuit 310 may receive a data strobe signal DQS from the memory controller 400 or send the data strobe signal DQS to the memory controller 400 through the sixth pin P16.

In the data DATA output operation of the memory device 300, the memory interface circuit 310 may receive a read enable signal nRE, which toggles, through the fifth pin P15 before outputting the data DATA. The memory interface circuit 310 may generate the data strobe signal DQS which toggles on the basis of toggling of the read enable signal nRE. For example, the memory interface circuit 310 may generate the data strobe signal DQS that starts to toggle after a predetermined delay (e.g., tDQSRE) on the basis of the toggling start time of the read enable signal nRE. The memory interface circuit 310 may send the data signal DQ including the data DATA on the basis of the toggle timing of the data strobe signal DQS. Accordingly, the data DATA is arranged at the toggle timing of the data strobe signal DQS and may be sent to the memory controller 400.

In the data DATA input operation of the memory device 300, when the data signal DQ including the data DATA is received from the memory controller 400, the memory interface circuit 310 may receive the data strobe signal DQS, which toggles together with the data DATA, from the memory controller 400. The memory interface circuit 310 may acquire the data DATA from the data signal DQ on the basis of the toggle timing of the data strobe signal DQS. For example, the memory interface circuit 310 may acquire the data DATA by sampling the data signal DQ at a rising edge and a falling edge of the data strobe signal DQS.

The memory interface circuit 310 may send a ready/busy output signal nR/B to the memory controller 400 through an eighth pin P18. The memory interface circuit 310 may send the state information of the memory device 300 to the memory controller 400 through the ready/busy output signal nR/B. When the memory device 300 is in the busy state (e.g., when the internal operations of the memory device 300 are being performed), the memory interface circuit 310 may send the ready/busy output signal nR/B indicating the busy state to the memory controller 400. When the memory device 300 is in the ready state (e.g., the internal operations of the memory device 300 are not performed or completed), the memory interface circuit 310 may send the ready/busy output signal nR/B indicating the ready state to the memory controller 400. For example, while the memory device 300 reads the data DATA from the memory cell array 330 in response to a page read command, the memory interface circuit 310 may send the ready/busy output signal nR/B indicating the busy state (e.g., a low level) to the memory controller 400. For example, while the memory device 300 programs the data DATA into the memory cell array 330 in response to the program command, the memory interface circuit 310 may send the ready/busy output signal nR/B indicating the busy state to the memory controller 400.

The control logic circuit 320 may control various operations of the memory device 300. The control logic circuit 320 may receive the command/address CMD/ADDR acquired from the memory interface circuit 310. The control logic circuit 320 may generate a control signal for controlling other components of the memory device 300 according to the received command/address CMD/ADDR. For example, the control logic circuit 320 may generate various control signals for programming the data DATA in the memory cell array 330 or reading the data DATA from the memory cell array 330. In addition, the control logic circuit 320 may generate control signals for adjusting the channel potential in the memory cell array. This will be explained in detail below through FIGS. 3 to 17.

The memory cell array 330 may store the data DATA acquired from the memory interface circuit 310 under the control of the control logic circuit 320. The memory cell array 330 may output the stored data DATA to the memory interface circuit 310 under the control of the control logic circuit 320. Further, the memory cell array 330 may adjust the channel potential in the memory cell array 330 under the control of the control logic circuit 320.

The memory cell array 330 may include a plurality of memory cells. For example, a plurality of memory cells may be flash memory cells. However, the present disclosure is not limited thereto, and the memory cells may be a Resistive Random Access Memory (RRAM) cell, a Ferroelectric Random Access Memory (FRAM) cell, a Phase Change Random Access Memory (PRAM) cell, a Thyristor Random Access Memory (TRAM) cell, and a Magnetic Random Access Memory (MRAM) cell. Hereinafter, an embodiment of the present disclosure will be explained mainly on the basis of an example in which the memory cell is a NAND flash memory cell.

The memory controller 400 may include first to eighth pins P21 to P28 and a controller interface circuit 410. The first to eighth pins P21 to P28 may correspond to the first to eighth pins P11 to P18 of the memory device 300.

The controller interface circuit 410 may send a chip enable signal nCE to the memory device 300 through the first pin P21. The controller interface circuit 410 may send and receive signals to and from the memory device 300 selected through the chip enable signal nCE through second to eighth pins P22 to P28.

The controller interface circuit 410 may send a command latch enable signal CLE, an address latch enable signal ALE, and a write enable signal nWE to the memory device 300 through the second to fourth pins P22 to P24. The controller interface circuit 410 may send the data signal DQ to the memory device 300 through the seventh pin P27 or receive the data signal DQ from the memory device 300 through the seventh pin P27.

The controller interface circuit 410 may send the data signal DQ, including the command CMD or the address ADDR, along with a toggling write enable signal nWE to the memory device 300. The controller interface circuit 410 may send the data signal DQ including the command CMD to the memory device 300 by sending the command latch enable signal CLE having an enable state, and may send the data signal DQ including the address ADDR to the memory device 300 by sending the address latch enable signal ALE having an enable state.

The controller interface circuit 410 may send the read enable signal nRE to the memory device 300 through the fifth pin P25. The controller interface circuit 410 may receive the data strobe signal DQS from the memory device 300 through the sixth pin P26, or may send the data strobe signal DQS to the memory device 300 through the sixth pin P26.

In the data DATA output operation of the memory device 300, the controller interface circuit 410 generates a toggling read enable signal nRE, and may send the read enable signal nRE to the memory device 300. For example, the controller interface circuit 410 may generate a read enable signal nRE that changes from the fixed state (e.g., a high level or a low level) to the toggle state before the data DATA is output. Thus, the toggling data strobe signal DQS may be generated on the basis of the read enable signal nRE in the memory device 300. The controller interface circuit 410 may receive the data signal DQ including the data DATA along with the toggling data strobe signal DQS from the memory device 300. The controller interface circuit 410 may acquire the data DATA from the data signal DQ on the basis of the toggle timing of the data strobe signal DQS.

In the data DATA input operation of the memory device 300, the controller interface circuit 410 may generate a toggling data strobe signal DQS. For example, the controller interface circuit 410 may generate a data strobe signal DQS that changes from the fixed state (e.g., a high level or a low level) to the toggle state before sending the data DATA. The controller interface circuit 410 may send the data signal DQ including the data DATA to the memory device 300 on the basis of the toggle timings of the data strobe signal DQS.

The controller interface circuit 410 may receive a ready/busy output signal nR/B from the memory device 300 through the eighth pin P28. The controller interface circuit 410 may determine the state information of the memory device 300 on the basis of the ready/busy output signal nR/B.

Figure 3:
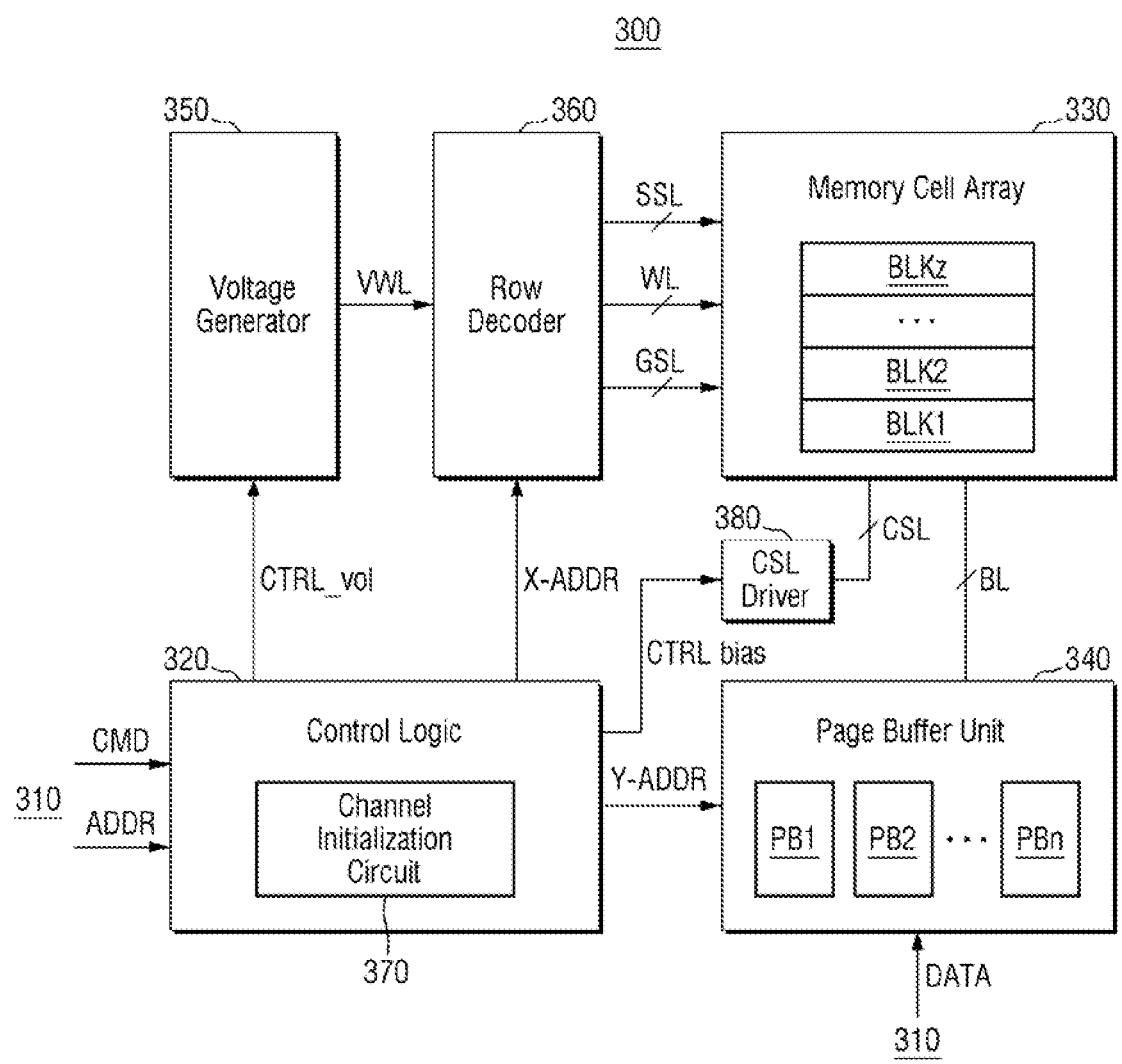
FIG. 3 is a block diagram showing a non-volatile memory device according to some embodiments of the present disclosure.

FIG. 3 is a block diagram showing a non-volatile memory device according to some embodiments of the present disclosure.

Referring to FIG. 3, a non-volatile memory device 300 according to some embodiments of the present disclosure may include a control logic circuit 320, a memory cell array 330, a page buffer unit 340, a voltage generator 350, a row decoder 360 and a column source line driver 380. The non-volatile memory device 300 may further include the memory interface circuit 310 shown in FIG. 2, and may further include a column logic, a free-decoder, a temperature sensor, a command decoder, an address decoder, and the like. The row decoder 360 may be connected to the memory cell array 330 via string select lines SSL, word lines WL and ground select lines GSL. The voltage generator 350 may generate and provide a word line voltage VWL to the row decoder 360. The memory cell array 330 may include a plurality of non-volatile memory blocks BLK1 to BLKz.

The control logic circuit 320 may control various operations in the memory device 300. The control logic circuit 320 may output various control signals in response to the command CMD and/or the address ADDR from the memory interface circuit 310 of FIG. 2. For example, the control logic circuit 320 may output a voltage control signal CTRL_vol, a row address X-ADDR, and a column address Y-ADDR.

Further, the control logic circuit 320 may include a channel initialization circuit 370. The channel initialization circuit 370 may output a common source line voltage control signal CTRL_bias and a column address Y-ADDR. The common source line voltage control signal CTRL_bias may be transferred from the channel initialization circuit 370 to the common source line driver 380. The common source line driver 380 receives the common source line voltage control signal CTRL_bias from the channel initialization circuit 370, and may provide a voltage to a common source line CSL in the non-volatile memory block. When the column address Y-ADDR is transferred to the page buffer unit 340, the page buffer unit 340 may provide a voltage to the bit line BL.

The channel initialization circuit 370 may control the common source line voltage control signal CTRL_bias and the column address Y-ADDR to apply an initialization pulse to the common source line CSL and the bit line BL. For example, the channel initialization circuit 370 may adjust the application time of the initialization pulse and the numerical value of the initialization pulse. In other words, the channel initialization circuit 370 may adjust how long the initialization pulse is applied and what level the initialization pulse has when it is applied. The channels in the non-volatile memory blocks BLK1 to BLKz are boosted through the initialization pulse for a certain period of time, and the voltage level (or potential) of the channels may be adjusted to a desired level. For example, the channels in the non-volatile memory blocks BLK1 to BLKz are boosted through the initialization pulse for a certain period of time, and the voltage level (or potential) of the channel reduced due to coupling with the word line may be initialized to the state it had before the reduction.

The configuration and operation of the channel initialization circuit 370 will be explained with reference to FIG. 4.

Figure 4:
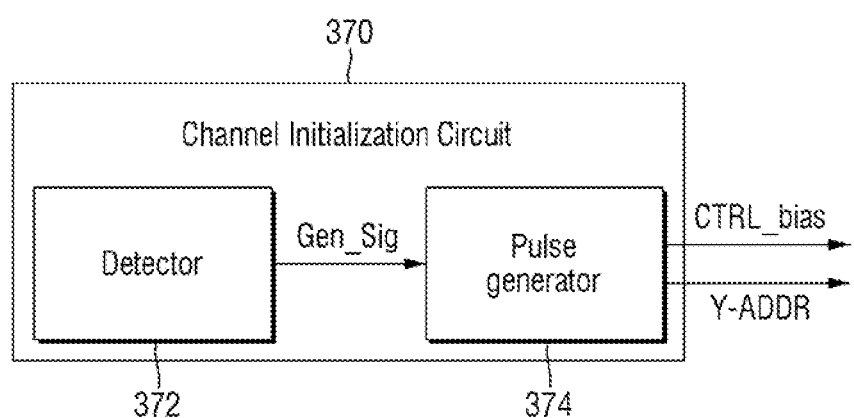
FIG. 4 is a block diagram showing a channel initialization circuit according to some embodiments of the present disclosure.

FIG. 4 is an exemplary block diagram showing a channel initialization circuit according to some embodiments of the present disclosure.

Referring to FIGS. 3 and 4, the channel initialization circuit 370 according to some embodiments of the present disclosure may include a detector 372 and a pulse generator 374. For reference, the configuration of the channel initialization circuit 370 is an example, and thus, the channel initialization circuit 370 may have various other configurations.

When a read operation of at least one of the non-volatile memory blocks BLK1 to BLKz is executed, the detector 372 may detect whether a noise occurs on the plurality of word lines WL before the read operation is executed. In other words, the detector 372 may detect if noise is present on at least one of the word lines WL.

The configuration of the channel initialization circuit 370 is not limited to the configuration of the detector 372 and the pulse generator 374. For example, the channel initialization circuit 370 may detect noise and apply an initialization pulse in a single configuration.

The noise which is detected by the detector 372 and occurs in the plurality of word lines WL before the read operation will be explained as an example through FIGS. 5 and 6 below.

Figure 5:
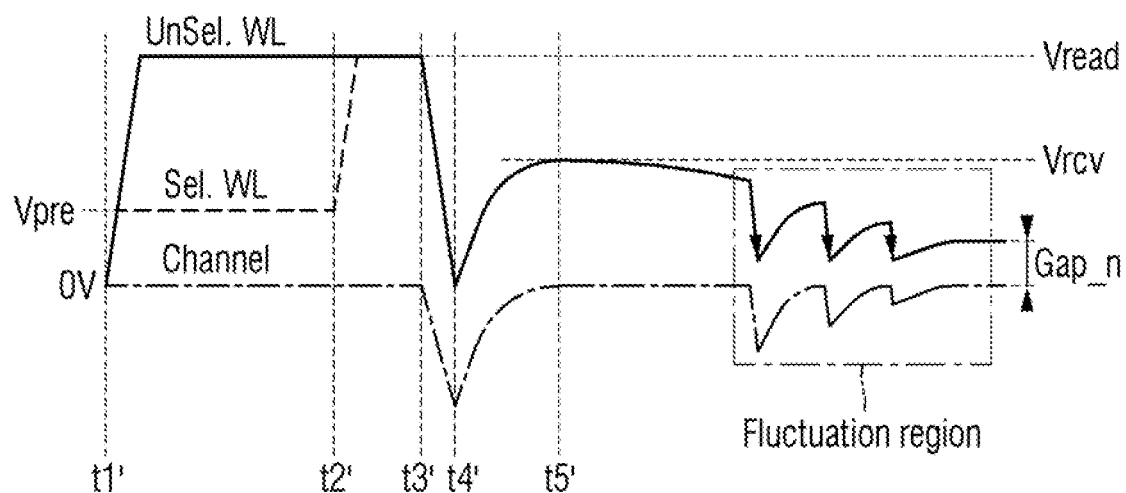
FIGS. 5 and 6 are timing diagrams for explaining the noise occurring in a noise region.
Figure 6:
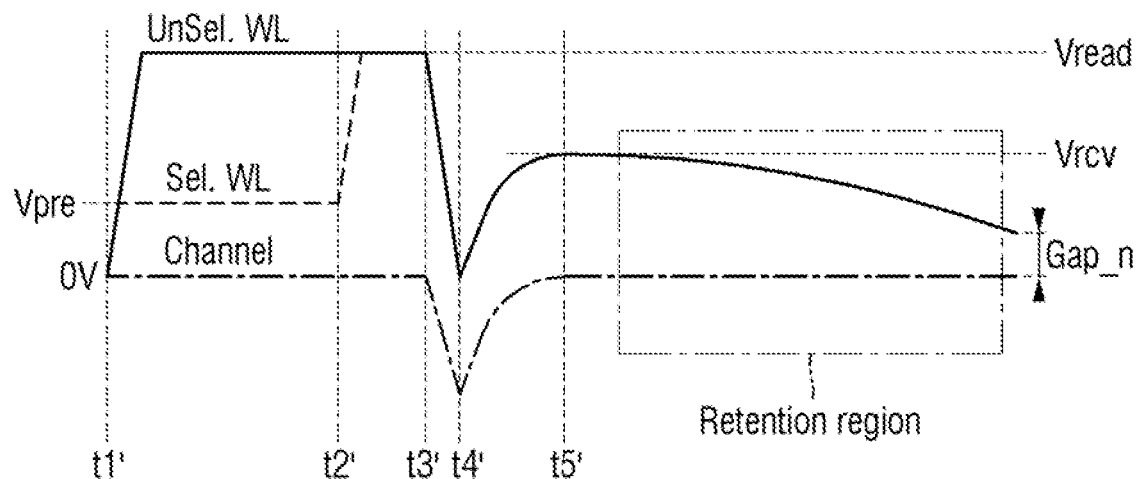

FIGS. 5 and 6 are timing diagrams for explaining noise occurring in a noise region.

Referring to FIGS. 3, 4, and 5, a noise region (Noise Region 1) occurring in the plurality of word lines WL may, for example, be a noise region which occurs in a target non-volatile memory block (e.g., BLK2) of a read operation, which is adjacent to a non-volatile memory block (e.g., BLK1) in which no read operation is executed, due to a switching operation on the word line connected to the non-volatile memory block (e.g., BLK1) in which no read operation is executed. In other words, the noise region may occur in the non-volatile memory block BLK2 (where the read operation is performed), due to a switching operation on the word line connected to the non-volatile memory BLK1 (where no read operation is performed).

When turning off the word line connected to the non-volatile memory block (e.g., BLK1) in which no read operation is executed, a fluctuation region may occur in the target non-volatile memory block (e.g., BLK2) where the read operation is performed because the target non-volatile memory block (e.g., BLK2) is adjacent to the non-volatile memory block (e.g., BLK1) in which no read operation is executed.

More specifically, before the read operation is executed on the non-volatile memory block (e.g., BLK2), after a pre-read operation is executed from a first time t1' to a fourth time t4', by repeatedly turning on and off the word line connected to the non-volatile memory block (e.g., BLK1) in which no read operation is executed, a plurality of word lines (UnSel.WL and Sel.WL) and the channel potential (Channel) of the non-volatile memory block (e.g., BLK2) may fluctuate together.

Accordingly, in a read operation non-selection word line UnSel.WL to which a read voltage Vread is applied from the first time t1' to the third time t3', the voltage level falls until the fourth time t4', a recovery voltage Vrcv is applied until the fifth time t5' for recovery, and then, the voltage level is gradually reduced via the fluctuation region.

Further, in a read operation selection word line Sel.WL to which a pre-charge voltage Vpre is applied from the first time t1' to the second time t2', the read voltage Vread is applied from the second time t2' to the third time t3', the voltage level then falls until the fourth time t4', the recovery voltage Vrcv is applied until the fifth time t5' for recovery, and then, the voltage level is gradually reduced via the fluctuation region.

In addition, the channel potential (Channel) located below a plurality of word lines (UnSel.WL and Sel.WL) maintains a constant voltage (e.g., 0 V) from the first time t1' to the third time t3', is coupled with the voltage of a plurality of word lines (UnSel.WL and Sel.WL) from the third time t3', decreases together with the voltage of the plurality of word lines (UnSel.WL and Sel.WL) to the fourth time t4', and increases from the fourth time t4'. After the fifth time t5', the channel potential (Channel) is affected by the fluctuation region.

After being affected by the fluctuation region, the voltage level of the plurality of word lines (UnSel.WL and Sel.WL) and the channel potential (Channel) may have a noise gap Gap_n. Therefore, at the time of the read operation after the noise region (Noise Region 1), by applying an initialization pulse Pulse_ini to the common source line CSL and/or bit line BL to reflect the noise gap Gap_n, the threshold voltage reliability of the non-volatile memory block being read can be increased.

Referring to FIGS. 3, 4, and 6, the noise region (Noise Region 2) occurring in the plurality of word lines (UnSel.WL and Sel.WL) may, for example, be a noise region caused by retention deterioration that occurs before the execution of read operation on the target non-volatile memory block of the read operation execution.

Retention deterioration that occurs in the target non-volatile memory block of the read operation execution may occur before execution of the read operation on the target non-volatile memory block of the read operation execution.

More specifically, before the read operation is executed on the non-volatile memory block which is an execution target of the read operation, after the pre-read operation is executed from the first time t1' to the fourth time t4', due to retention deterioration that occurs in the non-volatile memory block which is the execution target of the read operation, a retention region in which the voltage levels of a plurality of word line voltages (UnSel.WL and Sel.WL) fall may occur.

Accordingly, regarding the read operation non-selection word line UnSel.WL to which the read voltage Vread is applied from the first time t1' to the third time t3', the voltage level of the read operation non-selection word line UnSel.WL falls from the third time t3' until the fourth time t4', the recovery voltage Vrcv is applied until the fifth time t5' for recovery, and then, the voltage level of the read operation non-selection word line UnSel.WL is gradually reduced via the retention region.

In addition, regarding the read operation selection word line Sel.WL to which the pre-charge voltage Vpre is applied from the first time t1' to the second time t2', the read voltage Vread is applied from the second time t2' to the third time t3', the voltage level of the read operation selection word line Sel.WL falls until the fourth time t4', the recovery voltage Vrcv is applied until the fifth time t5' for recovery, and then, the voltage level of the read operation selection word line Sel.WL is gradually reduced via the retention region.

In addition, the channel potential (Channel) of the channel located below a plurality of word lines (UnSel.WL and Sel.WL) maintains a constant voltage (e.g., 0 V) from the first time t1' to the third time t3', is coupled with the voltages of the plurality of word lines (UnSel.WL and Sel.WL) from the third time t3' and decreases together with the voltages of the plurality of word lines (UnSel.WL and Sel.WL) to the fourth time t4', and increases from the fourth time t4'. After the fifth time t5', the channel potential (Channel) may be maintained constant during the retention region.

After being affected by the retention region, the voltage level of the plurality of word lines (UnSel.WL and Sel.WL) and the channel potential (Channel) may have a noise gap Gap_n. Therefore, at the time of the read operation after the noise region (Noise Region 2), by applying an initialization pulse Pulse_ini to the common source line CSL and/or bit line BL to reflect the noise gap Gap_n, the threshold voltage reliability of the non-volatile memory block can be increased.

An occurrence of the noise region or noise detected before performing the read operation by the non-volatile memory device according to some embodiments of the present disclosure is not limited to the examples explained in reference to FIGS. 5 and 6. As an example, the noise region or noise may be a leakage which occurs in a target word line of a read operation execution adjacent to word line in which no read operation is executed, due to an operation of a transistor that controls the switching of the word line in which no read operation is executed. As another example, the noise region or noise may be a noise which occurs in an open non-volatile memory block other than the target non-volatile memory block of a program operation during the program operation. The noise which occurs in a plurality of word lines WL before the read operation detected by the detector 372 is not limited to the aforementioned examples.

Referring to FIGS. 3 and 4 again, when the detector 372 detects the noise occurring in the plurality of WL word lines before the read operation execution when the read operation is executed on at least one of the non-volatile memory blocks BLK1 to BLKz, the detector 372 may transfer an initialization pulse generation signal Gen_Sig to the pulse generator 374.

The pulse generator 374 having received the initialization pulse generation signal Gen_Sig from the detector 372 may adjust the common source line voltage control signal CTRL_bias and the column address Y-ADDR, on the basis of the initialization pulse level and the initialization pulse application time information included in the pulse generation signal Gen_Sig. More specifically, the pulse generator 374 may adjust the common source line voltage control signal CTRL_bias to apply the pulse to the common source line CSL at the initialization pulse level and the application time included in the pulse generation signal Gen_Sig. In addition, the pulse generator 374 may adjust the common source line voltage control signal CTRL_bias to apply pulses to the bit line BL at the initialization pulse level and the application time included in the pulse generation signal Gen_Sig.

An operation in which the channel initialization circuit 370 according to some embodiments of the present disclosure applies the initialization pulse Pulse_ini to the common source line CSL and/or the bit line BL to increase the threshold voltage reliability of the non-volatile memory block will be explained through FIGS. 7 to 10 below.

Figure 7:
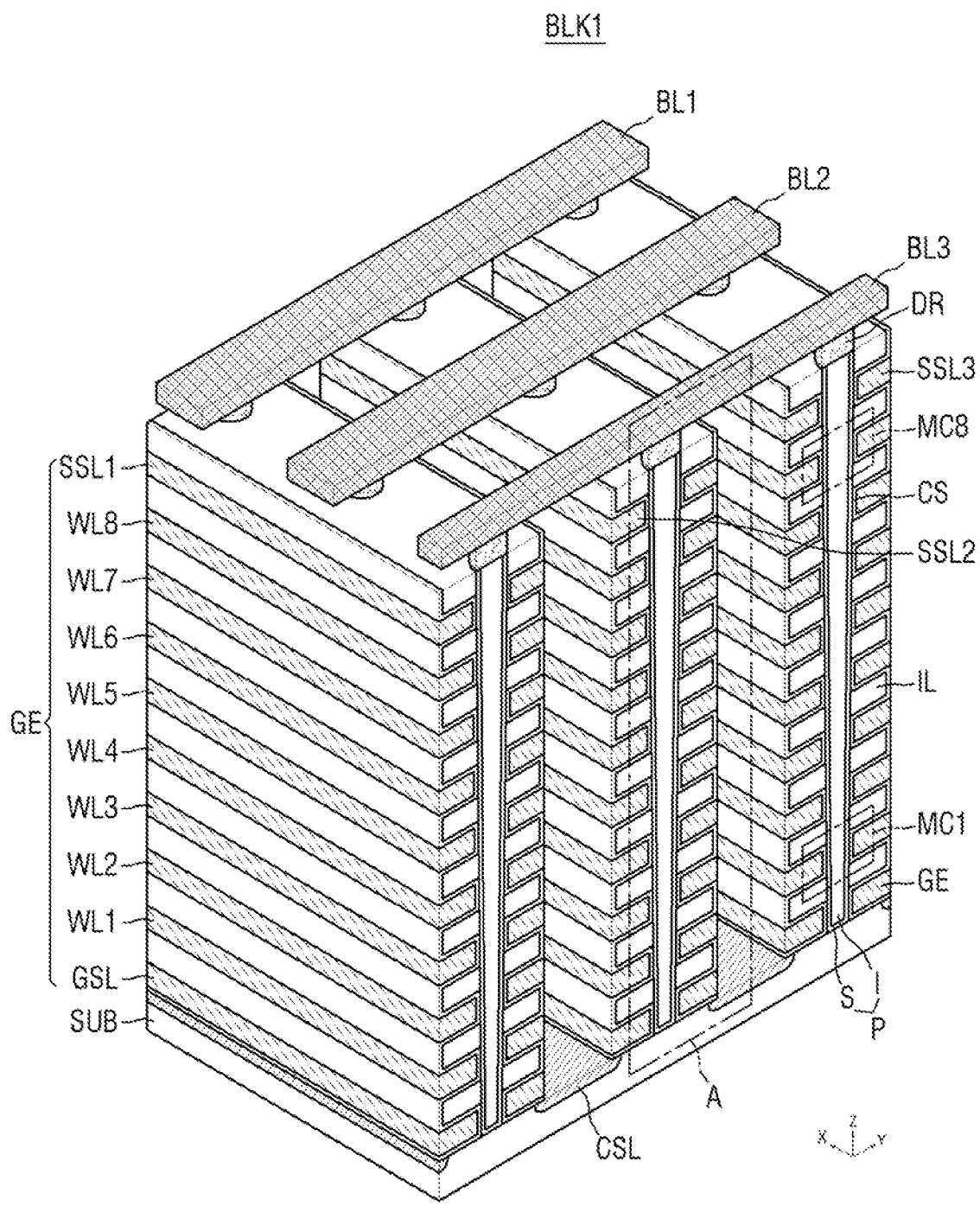
FIG. 7 is a perspective view showing a non-volatile memory block of the non-volatile memory device according to some embodiments of the present disclosure.

FIG. 7 is a perspective view showing a non-volatile memory block of the non-volatile memory device according to some embodiments of the present disclosure. For reference, although a first non-volatile memory block BLK1 will be explained below for convenience, the explanation of the first non-volatile memory block BLK1 may be used for the other non-volatile memory blocks BLK2 to BLKz.

Referring to FIG. 7, the first non-volatile memory block BLK1 may be formed in the vertical direction Z with respect to a substrate SUB. Although FIG. 7 shows that the first memory block BLK1 includes four selection lines GSL (e.g., ground selection line) and SSL1 to SSL3 (string selection lines), eight word lines WL1 to WL8, and three bit lines BL1 to BL3, the number thereof may actually be greater or smaller than those. For example, the first memory block BLK1 may include a GIDL line (e.g., GIDL_L2 of FIG. 8) stacked on the string selection lines SSL1 to SSL3 in the vertical direction Z. In addition, for example, the first non-volatile memory block BLK1 may include a GIDL line (e.g., GIDL_L1 of FIG. 8) below the ground selection line GSL. In addition, as another example, the first non-volatile memory block BLK1 may include one or more dummy word lines between the first word line WL1 and the ground selection line GSL and/or between the eighth word line WL8 and the string selection lines SSL1 to SSL3. A plurality of memory cells MC1 to MC8 are further provided in the first non-volatile memory block BLK1.

The substrate SUB may be a polysilicon film doped with a first conductive type (e.g., a p-type). The substrate SUB may be a bulk silicon substrate, a silicon-on insulator (SOI) substrate, a germanium substrate, a germanium-on insulator (GOI) substrate, a silicon-germanium substrate or a substrate of an epitaxial thin film acquired by performing a selective epitaxial growth (SEG). The substrate SUB may be made of a semiconductor material, and may include at least one of, for example, silicon (Si), germanium (Ge), silicon germanium (SiGe), gallium arsenide (GaAs), indium gallium arsenide (InGaAs), aluminum gallium arsenide (AlGaAs) or a mixture thereof.

The substrate SUB may be provided with a common source line CSL that extends along a first direction X on the substrate SUB and is doped with a second conductive type (e.g., an n-type) of impurity. On the region of the substrate SUB between the two adjacent common source lines CSL, a plurality of insulation films IL extending along the first direction X is provided sequentially along the third direction Z, and the plurality of insulation films IL may be spaced by a specific distance along the third direction Z. For example, the plurality of insulation films IL may include an insulation material such as silicon oxide.

A plurality of pillars P sequentially placed along the first direction X and penetrating the plurality of insulation films IL along the third direction Z may be provided on the region of the substrate SUB between the two adjacent common source lines CSL. For example, the plurality of pillars P may penetrate the plurality of insulation films IL and come into contact with the substrate SUB. For example, a surface layer S of each pillar P may include a silicon material doped with a first conductive type and may function as a channel region. In addition, an inner layer 1 of each pillar P may include an insulation material such as silicon oxide or an air gap.

In a region between the two adjacent common source lines CSL, a charge storage layer CS may be provided along the exposed surfaces of the insulation films IL, the pillars P and the substrate SUB. The charge storage layer CS may include a gate insulation layer (also referred to as a "tunneling insulation layer"), a charge trap layer and a blocking insulation layer. For example, the charge storage layer CS may have an oxide-nitride-oxide (ONO) structure. In addition, a gate electrode GE such as the selection lines GSL and SSL1 to SSL3 and word lines WL1 to WL8 may be provided on the exposed surface of the charge storage layer CS, in the region between the two adjacent common source lines CSL.

Drains or drain contacts DR may be provided on a plurality of pillars P, respectively. For example, the drains or the drain contacts DR may include a silicone material doped with impurity having a second conductive type. Bit lines BL1 to BL3 that extend in a second direction Y and are spaced apart by a specific distance along the first direction X may be provided on the drain contacts DR.

Figure 8:
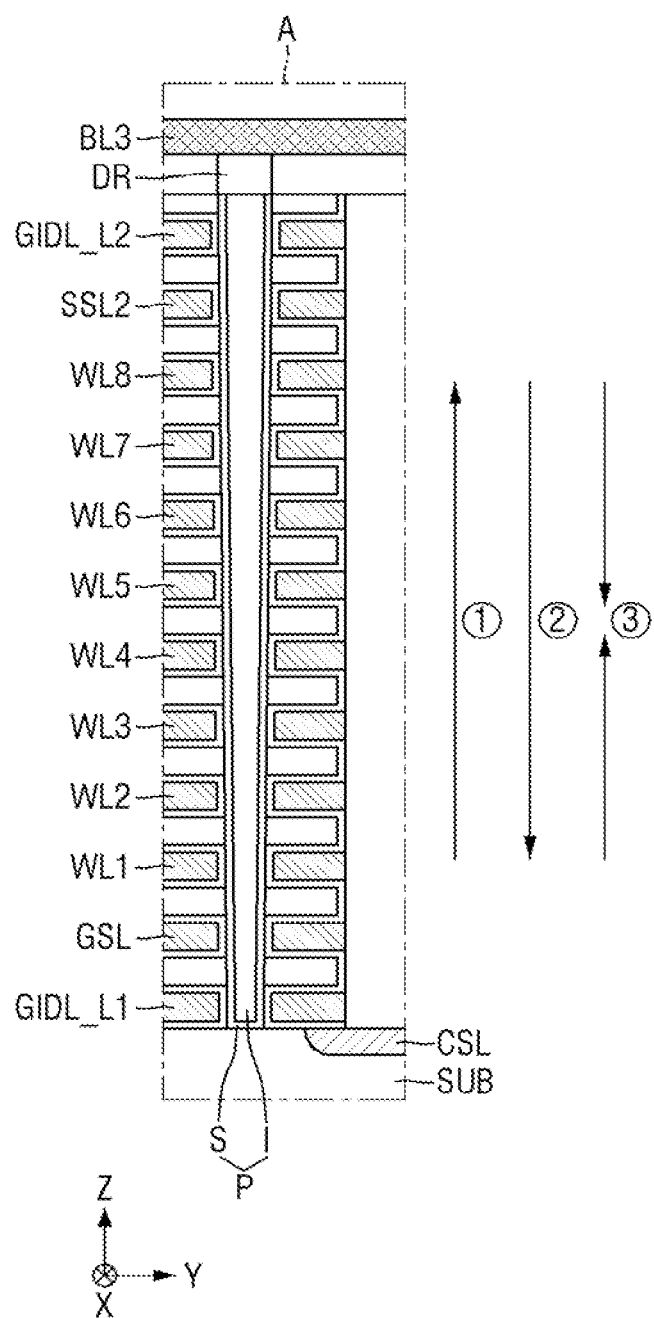
FIG. 8 is an enlarged view of a region A of FIG. 7.

FIG. 8 is an enlarged view of a region A of FIG. 7. For reference, the explanation of the bit line BL3 also applies to other bit lines BL1 and BL2.

Referring to FIG. 8, various application directions of the initialization pulse for an arbitrary cell string are shown. As an example, the initialization pulse application of the cell string may be executed in a direction of the common source line CSL (ⓐ). In other words, when the initialization pulse is applied, the channel potential level of the cell string may be adjusted through the common source line CSL.

As another example, the initialization pulse application operation of the cell string may be executed in the direction of the bit line BL3 (ⓑ). In other words, when the initialization pulse is applied, the channel potential level of the cell string may be adjusted through the bit line BL3.

As still another example, the initialization pulse application operation of the cell string may be executed in both directions of the common source line CSL and the bit line BL3 (ⓒ). In other words, when the initialization pulse is applied, the channel potential level of the cell string may be adjusted through both of the common source line CSL and the bit line BL3.

Figure 9:
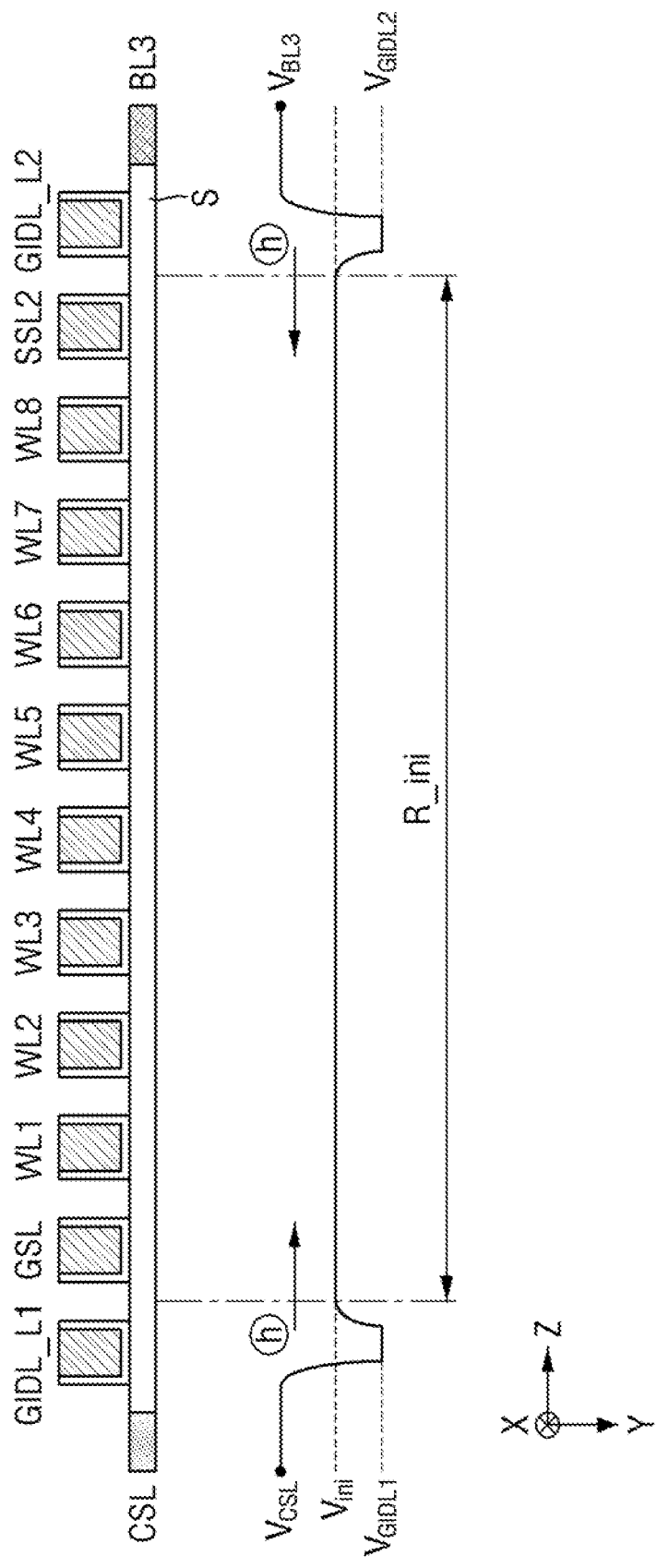
FIG. 9 is a diagram for explaining the operation of adjusting the channel potential level of the non-volatile memory device according to some embodiments of the present disclosure.

FIG. 9 is a diagram for explaining the operation of adjusting the channel potential level of the non-volatile memory device according to some embodiments of the present disclosure. For reference, although an example of applying an initialization pulse Pulse_ini to both the bit line BL3 and the common source line CSL through the channel initialization circuit 370 of FIG. 3 will explained, the initialization pulse Pulse_ini may be applied only to the bit line BL3. In addition, the initialization pulse Pulse_ini may be applied only to the common source line CSL.

Referring to FIGS. 3 and 9, when the initialization pulse Pulse_ini is applied to the common source line CSL and the bit line BL through the channel initialization circuit 370, a Gate Induced Drain Leakage (GIDL) may occur on the surface layer S below a plurality of GIDLs lines GIDL_L1 and GIDL_L2.

More specifically, since the initialization pulse level ($V_{CSL}$ for example, 3 V) applied to the common source line CSL and the initialization pulse level ($V_{BL3}$, 3V) applied to the bit line BL have higher values than the voltage (for example, −3 V) applied to the plurality of GIDL lines GIDL_L1 and GIDL_L2, a GIDL may occur on the surface layer S below the plurality of GIDL lines GIDL_L1 and GIDL_L2. The initialization pulse level $V_{CSL}$ applied to the common source line CSL and the initialization pulse level $V_{BL3}$ applied to the bit line BL are enough to generate a GIDL on the surface layer S below the plurality of GIDL lines GIDL_L1 and GIDL_L2. In other words, the initialization pulse level $V_{CSL}$ applied to the common source line CSL and the initialization pulse level $V_{BL3}$ applied to the bit line BL may be the same as or different from each other.

Since a GIDL occurs on the surface layer S below the plurality of GIDL lines GIDL_L1 and GIDL_L2 through the initialization pulse level $V_{CSL}$ applied to the common source line CSL and the initialization pulse level $V_{BL3}$ applied to the bit line BL, sufficient halls may occur. Since a large number of halls occurring due to the GIDL moves to the channel region R_ini below the plurality of metal lines (e.g., GSL, WL1 to WL8, and SSL2), the channel potential may be increased to an initialization voltage $V_{ini}$.

In other words, by applying the initialization pulse Pulse_ini to the bit line BL3 and/or the common source line CSL through the channel initialization circuit 370 according to some embodiments of the present disclosure, the potential of the channel region R_ini is increased to a desired level (e.g., the level of initialization voltage $V_{ini}$) and the potential of the channel region R_ini is maintained at a constant level (e.g., the level of initialization voltage $V_{ini}$). Therefore, the threshold voltage reliability of the channel region R_ini can be increased.

An operation of applying the initialization pulse Pulse_ini to the bit line BL3 and/or the common source line CSL through the channel initialization circuit 370 according to some embodiments of the present disclosure to increase the potential of the channel region R_ini to a desired level (e.g., the level of initialization voltage $V_{ini}$) will be explained in detail through FIG. 10 below.

Figure 10:
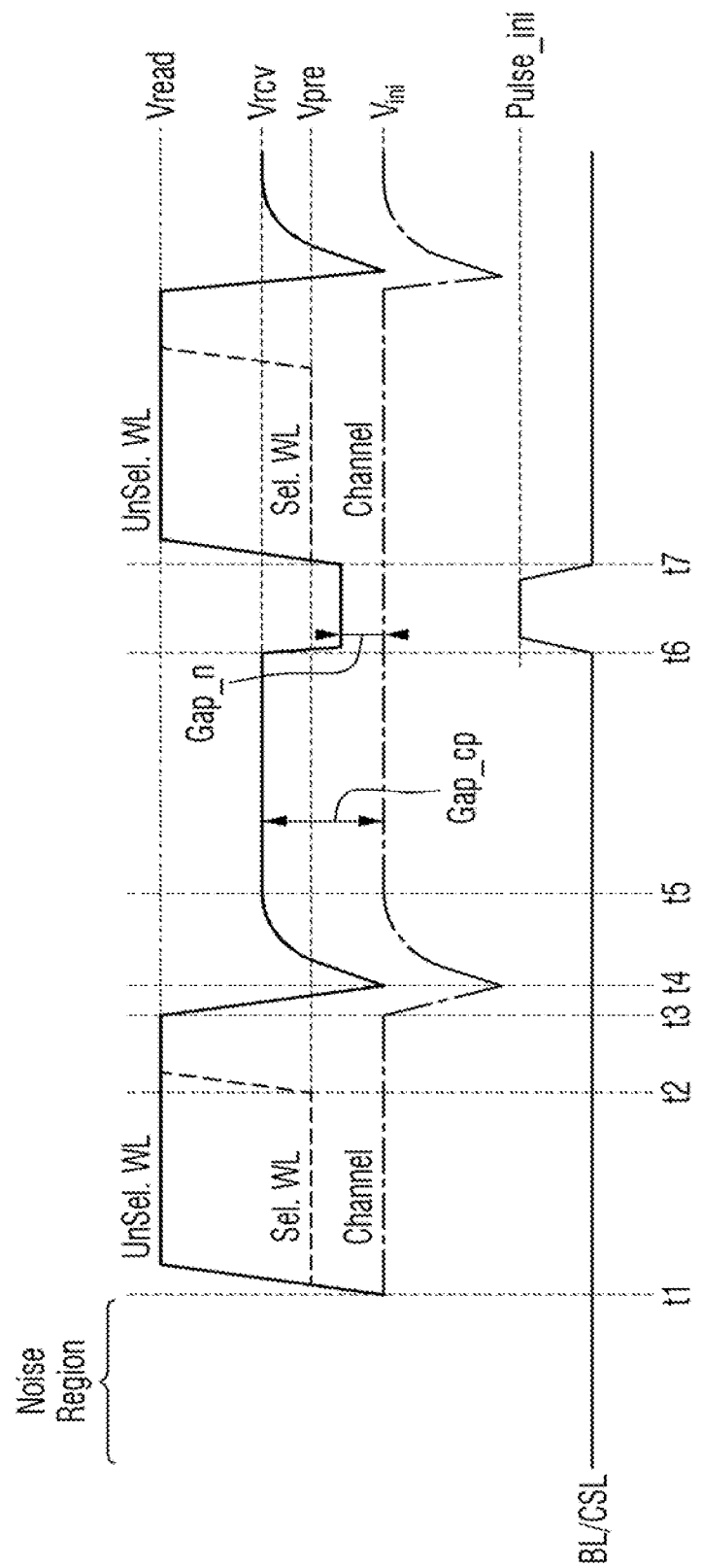
FIG. 10 is a timing diagram for explaining the operation of the non-volatile memory device according to some embodiments of the present disclosure.

FIG. 10 is a timing diagram for explaining the operation of the non-volatile memory device according to some embodiments of the present disclosure.

Referring to FIGS. 3, 4 and 10, to perform the read operation of the non-volatile memory device according to some embodiments of the present disclosure, the read voltage Vread may be applied to non-selection word line UnSel.WL other than the read target word line from the first time t1 to the third time t3. The pre-charge voltage Vpre may be applied to the selected word line Sel.WL which is the read target from the first time t1 to the second time t2. After that, the read voltage Vread may be applied to the selected word line Sel.WL from the second time t2 to the third time t3. After that, the recovery operation of a plurality of word lines (UnSel.WL and Sel.WL) may be executed from the third time t3 to the subsequent read operation start time t7. In the recovery operation, the plurality of word lines (UnSel.WL and Sel.WL) may fall to a level lower than the initialization voltage Vini level at the fourth time t4 before maintaining the recovery voltage Vrcv level. For example, the plurality of word lines (UnSel.WL and Sel.WL) and channels may be coupled to each other and may fall together to a level lower than the initialization voltage Vini level. The plurality of word lines (UnSel.WL and Sel.WL) and the channels coupled to each other may maintain the coupling gap Gap_cp until the sixth time t6 at which the initialization pulse Pulse_ini is applied. The plurality of word lines (UnSel.WL and Sel.WL) may reach the recovery voltage Vrcv level after the fifth time t5.

A read operation on a part of some of the non-volatile memory blocks (e.g., BLK1) of the non-volatile memory device according to some embodiments of the present disclosure may be executed from the first time t1. In the following, for convenience of explanation, the description will be made assuming that the detector 372 of FIG. 4 detects the noise region and transfers the initialization pulse generation signal Gen_Sig to the pulse generator 374.

In this case, the channel initialization circuit 370 may detect whether there is a noise region in which a noise occurs before the first time t1. For example, the detector 372 of the channel initialization circuit 370 may detect whether there is a noise region in which a noise occurs before the first time t1. Since the explanation of the noise region in which a noise occurs is similar to that explained with reference to FIGS. 5 and 6, the explanation thereof will not be provided.

When the channel initialization circuit 370 detects an occurrence of noise region in which a noise occurs before the first time t1, the channel initialization circuit 370 may apply the initialization pulse Pulse_ini to the bit line BL and/or the common source line CSL during a certain section (e.g., from the sixth time t6 to the seventh time t7).

For example, the non-volatile memory device 300 according to some embodiments of the present disclosure may execute a first read operation that executes the read operation from the first time t1, and a plurality of read operations that executes the read operation from the seventh time t7. For example, the first read operation may include a first read section (from the first time t1 to the third time t3). Further, the second read operation may include a second read section (from the seventh time t7 to a time after a certain time). In this case, the initialization pulse Pulse_ini applied to the bit line BL and/or the common source line CSL may be applied for at least a partial section between the first read section and the second read section. In other words, the initialization pulse Pulse_ini may be applied during a partial section between the third time t3 when the first read operation ends and the seventh time t7 when the second read operation starts.

In other words, the initialization pulse Pulse_ini according to some embodiments of the present disclosure may be applied from the third time point t3 when the first read operation ends. Here, the time when the initialization pulse Pulse_ini ends is before the seventh time t7. However, the time when the initialization pulse Pulse_ini ends may be at the seventh time t7. For example, the initialization pulse Pulse_ini according to some embodiments of the present disclosure may end at the seventh time t7 when the second read operation starts. Here, the time for applying the initialization pulse Pulse_ini is after the third time t3. However, the time for applying the initialization pulse Pulse_ini may be the third time t3.

The level of the initialization pulse Pulse_ini applied by the non-volatile memory device 300 according to some embodiments of the present disclosure is enough to make the level of the channel potential (Channel) reach the initialization voltage $V_{ini}$.

In other words, a certain level of initialization pulse Pulse_ini may be applied to the bit line BL and/or the common source line CSL for a certain section, thereby adjusting a difference between the voltage level of the plurality of word lines (UnSel.WL and Sel.WL) and the level of the channel potential (Channel) of the channel region to converge to the noise gap Gap_n occurring in the noise region. In other words, the voltage levels of the plurality of word lines (UnSel.WL and Sel.WL) increased through the read voltage Vread applied at the first time t1 may be made to be identical to the voltage levels of the plurality of word lines (UnSel.WL and Sel.WL) increased through the read voltage Vread applied at the seventh time t7. For example, a constant level of initialization pulse Pulse_ini may be applied to the bit line BL and/or the common source line CSL for a constant section or time period (e.g., from the third time t3 to the seventh time t7) between the plurality of read sections, thereby increasing the threshold voltage reliability of the non-volatile memory blocks BLK1 to BLKz.

A case where the non-volatile memory device 300 according to some embodiments of the present disclosure does not apply a constant level of the initialization pulse Pulse_ini to the bit line BL and/or common source line CSL for a constant section will be compared and explained through FIG. 11 below. Hereinafter, repeated parts of contents explained above will not be explained again.

Figure 11:
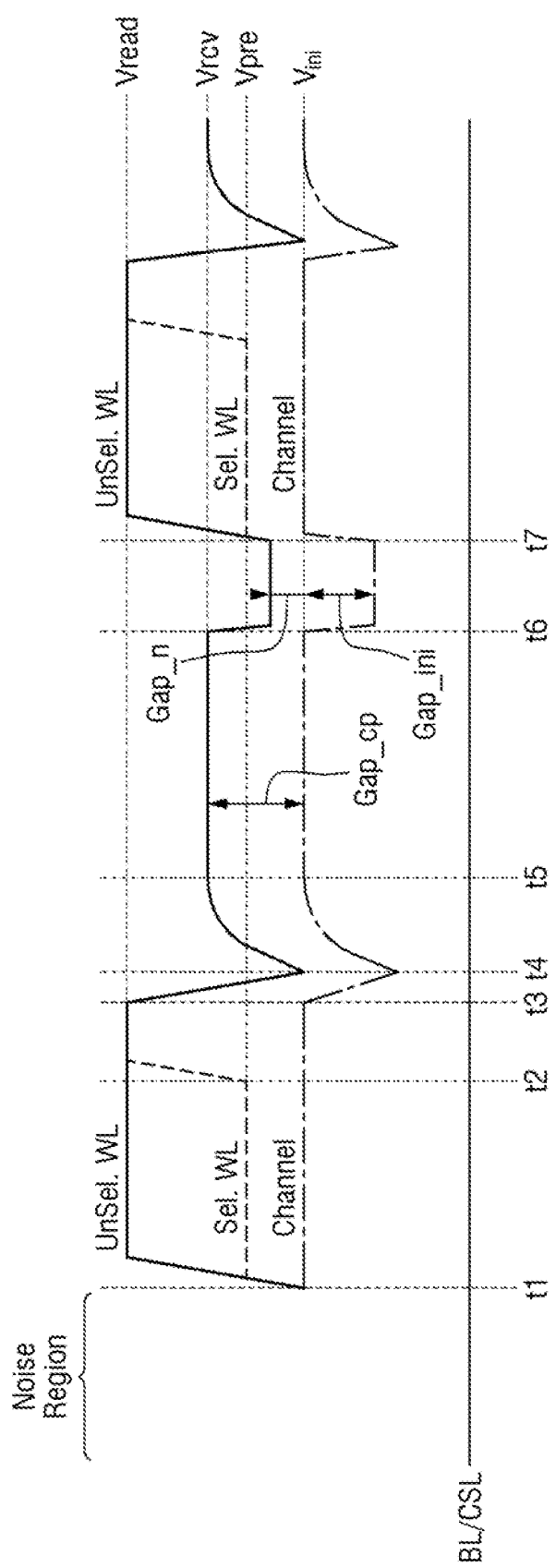
FIG. 11 is a timing diagram for explaining the operation of the non-volatile memory device which does not execute the channel initialization.

FIG. 11 is a timing diagram for explaining the operation of the non-volatile memory device which does not execute the channel initialization.

Referring to FIG. 11, when a constant level of the initialization pulse Pulse_ini is not applied to the bit line BL and/or the common source line CSL for a constant section, the level of the channel potential (Channel) of the channel region may have a level that decreases from the initialization voltage Vini level by the initialization gap Gap_ini at the sixth time t6. In other words, because the channel potential (Channel) level has an unstable state before the seventh time t7 when the second read operation is executed, the non-volatile memory device according to some embodiments of the present disclosure applies the initialization pulse Pulse_ini to the bit line BL and/or the common source line CSL for a partial section between the plurality of read operation sections, increases the channel potential (Channel) level to the initialization gap Gap_ini level, and may adjust a level difference between the channel potential (Channel) level and the voltage levels of the plurality of word lines (UnSel.WL and Sel.WL) to the noise gap Gap_n.

The operation of the non-volatile memory device according to some embodiments of the present disclosure will be explained as an example through a flowchart and a ladder diagram through FIGS. 12 and 13 below.

Figure 12:
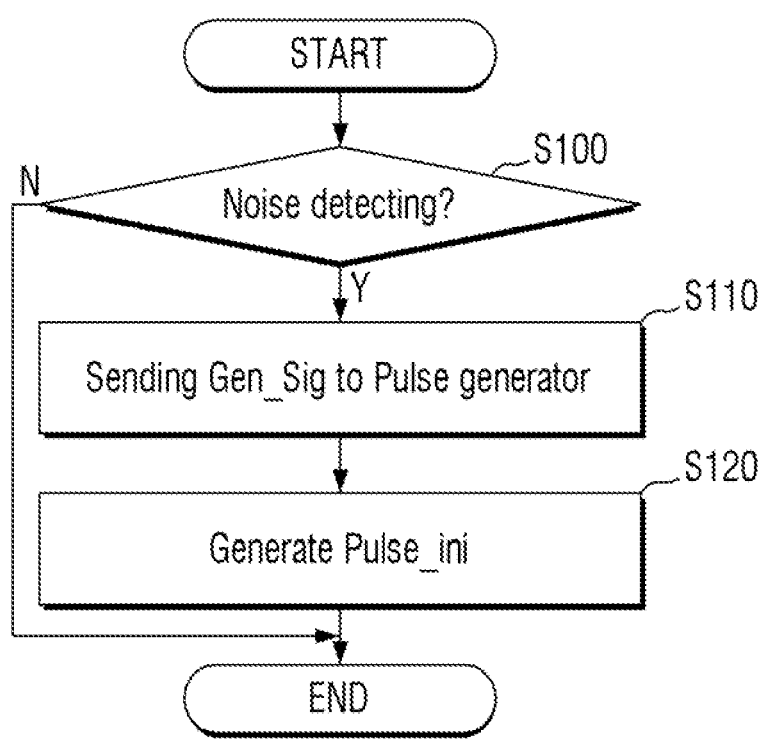
FIG. 12 is a flowchart showing the operation of the channel initialization circuit according to some embodiments of the present disclosure.

FIG. 12 is an exemplary flowchart showing the operation of the channel initialization circuit according to some embodiments of the present disclosure.

Referring to FIGS. 3 and 12, the channel initialization circuit 370 according to some embodiments of the present disclosure detects an occurrence of a noise region in which a noise occurs before performing the read operation (S100). If the channel initialization circuit 370 does not detect the occurrence of the noise region in which a noise occurs, the application of the initialization pulse N is stopped.

If the channel initialization circuit 370 detects the occurrence of a noise region (Y), the channel initialization circuit 370, e.g., the detector 372 sends a pulse generation signal Gen_Sig to the pulse generator 374 (S110). The pulse generator 374 which receives the pulse generation signal Gen_Sig may generate the initialization pulse Pulse_ini applied to the bit line BL and/or the common source line (S120).

Figure 13:
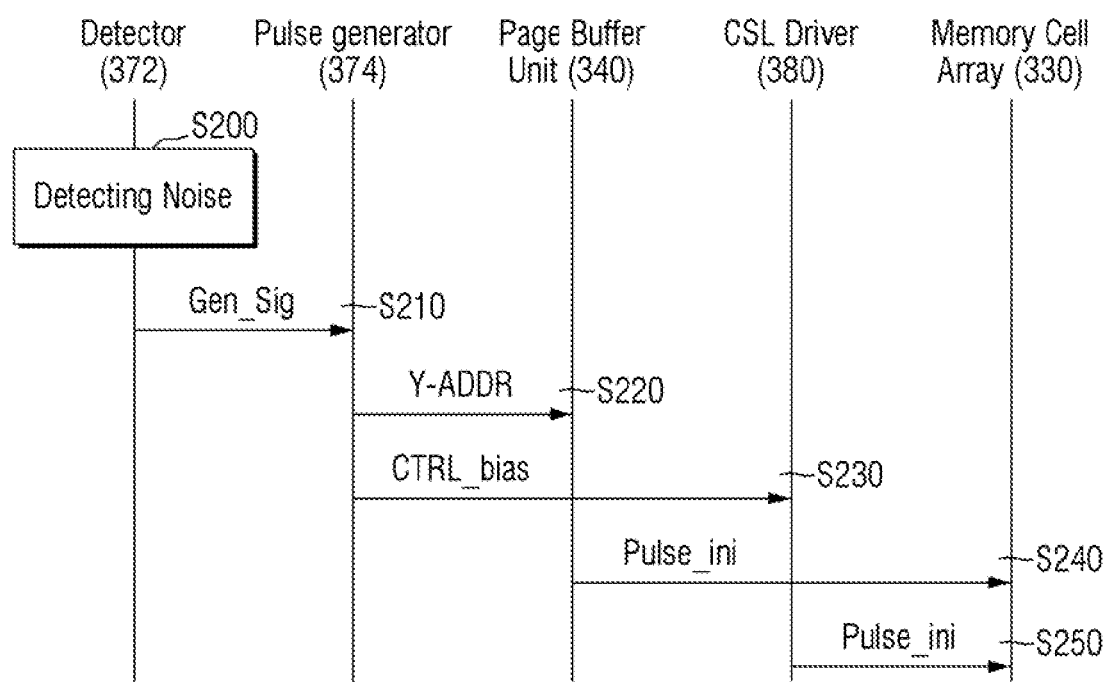
FIG. 13 is a ladder diagram showing the operation of the non-volatile memory device according to some embodiments of the present disclosure.

FIG. 13 is a ladder diagram showing the operation of the non-volatile memory device according to some embodiments of the present disclosure.

Referring to FIGS. 3, 4 and 13, before the non-volatile memory device 300 according to some embodiments of the present disclosure executes the read operation, when the detector 372 detects an occurrence of a noise region in which a noise occurs (S200), the detector 372 sends the pulse generation signal Gen_Sig to the pulse generator 374 (S210). The pulse generator 374 sends the column address Y-ADDR to the page buffer unit 340 to apply the initialization pulse to the bit line BL on the basis of information on the initialization pulse level and the application time included in the pulse generation signal Gen_Sig (S220). In addition, the pulse generator 374 applies the common source line voltage control signal CTRL_bias to the common source line driver 380 to apply the initialization pulse to the common source line CSL on the basis of the information on the initialization pulse level and the application time included in the pulse generation signal Gen_Sig (S230). Here, if the initialization pulse is applied only to the bit line BL, step S230 may be omitted, and if the initialization pulse is applied only to the common source line CSL, step S220 may be omitted. In addition, steps S220 and S230 may be performed at the same time, and step S230 may be executed earlier than step S220. Afterwards, the page buffer unit 340 may apply the initialization pulse Pulse_ini to the bit line BL of the non-volatile memory block of the memory cell array 330 (S240). In addition, the common source line driver 380 may apply the initialization pulse Pulse_ini to the common source line CSL of the memory cell array 330 (S250). Steps S240 and S250 may be executed at the same time, and step S250 may be executed before the step S240.

Figure 14:
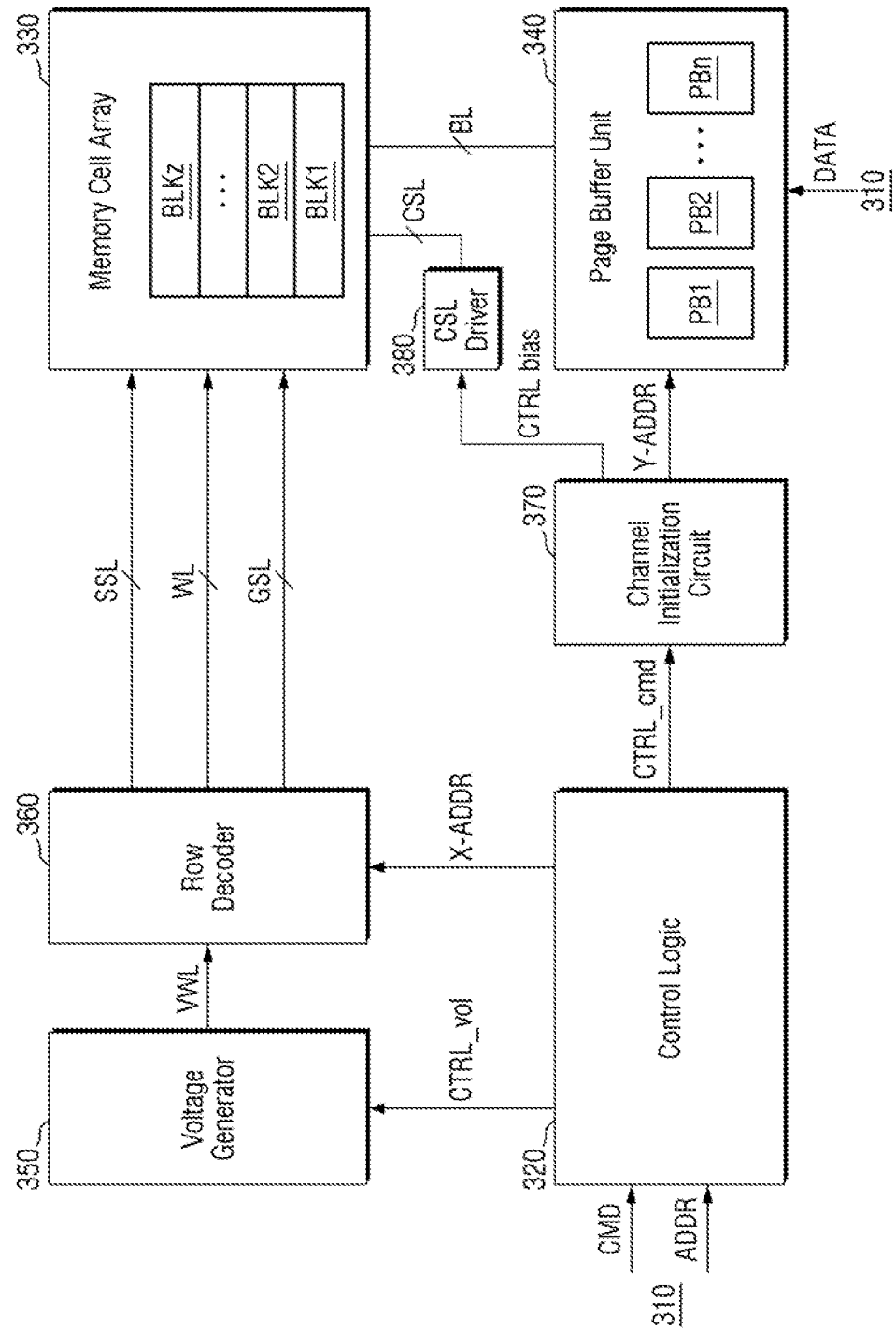
FIG. 14 is a block diagram showing another non-volatile memory device according to some embodiments of the present disclosure.

FIG. 14 is a block diagram showing another non-volatile memory 302 device according to some embodiments of the present disclosure.

Referring to FIG. 14, unlike FIG. 3, a channel initialization circuit 370 is separately placed outside the control logic 320. The channel initialization circuit 370 may generate the common source line voltage control signal CTRL_bias and the column address Y-ADDR in response to a control signal CTRL_cmd provided from the control logic 320. Since other explanations are the same as those of FIG. 3, the explanations thereof may not be provided.

Referring to FIG. 3 again, the memory cell array 330 may include a plurality of non-volatile memory blocks BLK1 to BLKz (z is a positive integer), and each of the plurality of non-volatile memory blocks BLK1 to BLKz may include a plurality of memory cells. The memory cell array 330 may be connected to the page buffer unit 340 through the bit line BL, and may be connected to the row decoder 360 through the word lines WL, the string selection lines SSL, and the ground selection lines GSL.

In an embodiment of the present disclosure, the memory cell array 330 may include a three-dimensional memory cell array, and the three-dimensional memory cell array may include a plurality of NAND strings. Each NAND string may include memory cells each connected to word lines vertically stacked on a substrate. U.S. Pat. Nos. 7,679,133, 8,553,466, 8,654,587, 8,559,235, and U.S. Patent Application Publication No. 2011/0233648, which describe three-dimensional memory cell arrays, are incorporated by reference herein in their entireties. In an embodiment of the inventive concept, the memory cell array 330 may include a two-dimensional memory cell array, and the two-dimensional memory cell array may include a plurality of NAND strings placed along the row and column directions.

The page buffer unit 340 may include a plurality of page buffers PB1 to PBn (n is an integer of 3 or more), and each of the plurality of page buffers PB1 to PBn may be connected to the memory cells through the plurality of bit lines BL. The page buffer unit 340 may select at least one bit line among the bit lines BL in response to the column address Y-ADDR. The page buffer unit 340 may operate as a write driver or a detection amplifier depending on an operating mode. For example, at the time of a program operation, the page buffer unit 340 may apply a bit line voltage corresponding to the data to be programmed to the selected bit line. At the time of a read operation, the page buffer unit 340 may detect the current or voltage of the selected bit line and detect the data stored in the memory cell.

The voltage generator 350 may generate various types of voltages for executing program, read, and erase operations on the basis of the voltage control signal CTRL_vol. For example, the voltage generator 350 may generate a program voltage, a read voltage, a program verification voltage, an erasure voltage, and the like as the word line voltage VWL.

The row decoder 360 may select one of a plurality of word lines WL in response to the row address X-ADDR, and select one of a plurality of string selection lines SSL. For example, at the time of the program operation, the row decoder 360 may apply a program voltage and a program verification voltage to the selected word line, and may apply a read voltage to the selected word line at the time of the read operation.

Figure 15:
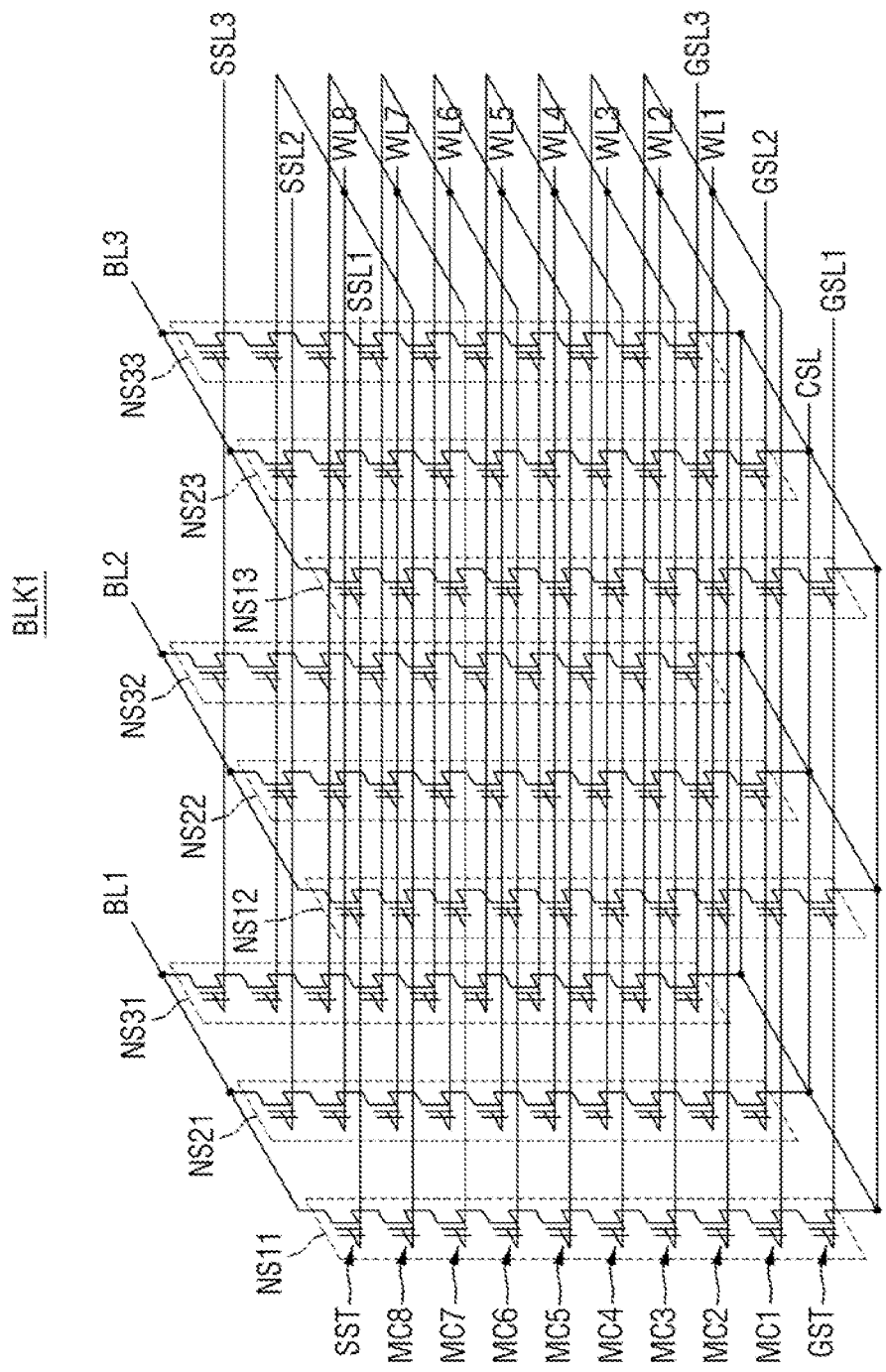
FIG. 15 is a circuit diagram showing a non-volatile memory block of a non-volatile memory device according to some embodiments of the present disclosure.

FIG. 15 is an exemplary circuit diagram showing a non-volatile memory block of a non-volatile memory device according to some embodiments of the present disclosure.

FIG. 15 is a diagram for explaining a three-dimensional (3D) V-NAND structure that may be applied to the non-volatile memory device according to some embodiments of the present disclosure. When the storage module of the non-volatile memory device is implemented as a 3D V-NAND type flash memory, each of the plurality of memory blocks constituting the storage module may be represented by an equivalent circuit as shown in FIG. 15.

A memory block BLK1 shown in FIG. 15 shows a three-dimensional memory block formed on the substrate in a three-dimensional structure. For example, a plurality of memory NAND strings included in the memory block BLK1 may be formed in a direction perpendicular to the substrate.

Referring to FIG. 15, the memory block BLK1 may include a plurality of memory NAND strings NS11 to NS33 connected between the bit lines BL1, BL2 and BL3 and the common source line CSL. Each of the plurality of memory NAND strings NS11 to NS33 may include a string selection transistor SST, a plurality of memory cells MC1, MC2, . . . , MC8 and a ground selection transistor GST. Although FIG. 15 shows that each of the plurality of memory NAND strings NS11 to NS33 include eighth memory cells MC1, MC2, . . . , MC8, the present disclosure is not limited thereto.

The string selection transistor SST may be connected to the corresponding string selection lines SSL1, SSL2 and SSL3. A plurality of memory cells MC1, MC2, . . . , MC8 may be connected to the respective corresponding word lines WL1, WL2, WL8. Some of the word lines WL1, WL2, . . . WL8 may correspond to dummy word lines. The ground selection transistor GST may be connected to the corresponding ground selection lines GSL1, GSL2 and GSL3. The string selection transistor SST may be connected to the corresponding bit lines BL1, BL2 and BL3 and the ground selection transistor GST may be connected to the common source line CSL.

Word lines of the same height (e.g., WL1) are connected in common, and the ground selection lines GSL1, GSL2 and GSL3 and the string selection lines SSL1, SSL2 and SSL3 may be separated from each other. Although FIG. 15 shows that the memory block BLK1 is connected to eighth word lines WL1, WL2, . . . WL8 and three bit lines BL1, BL2 and BL3, the present disclosure is not limited thereto.

Figure 16:
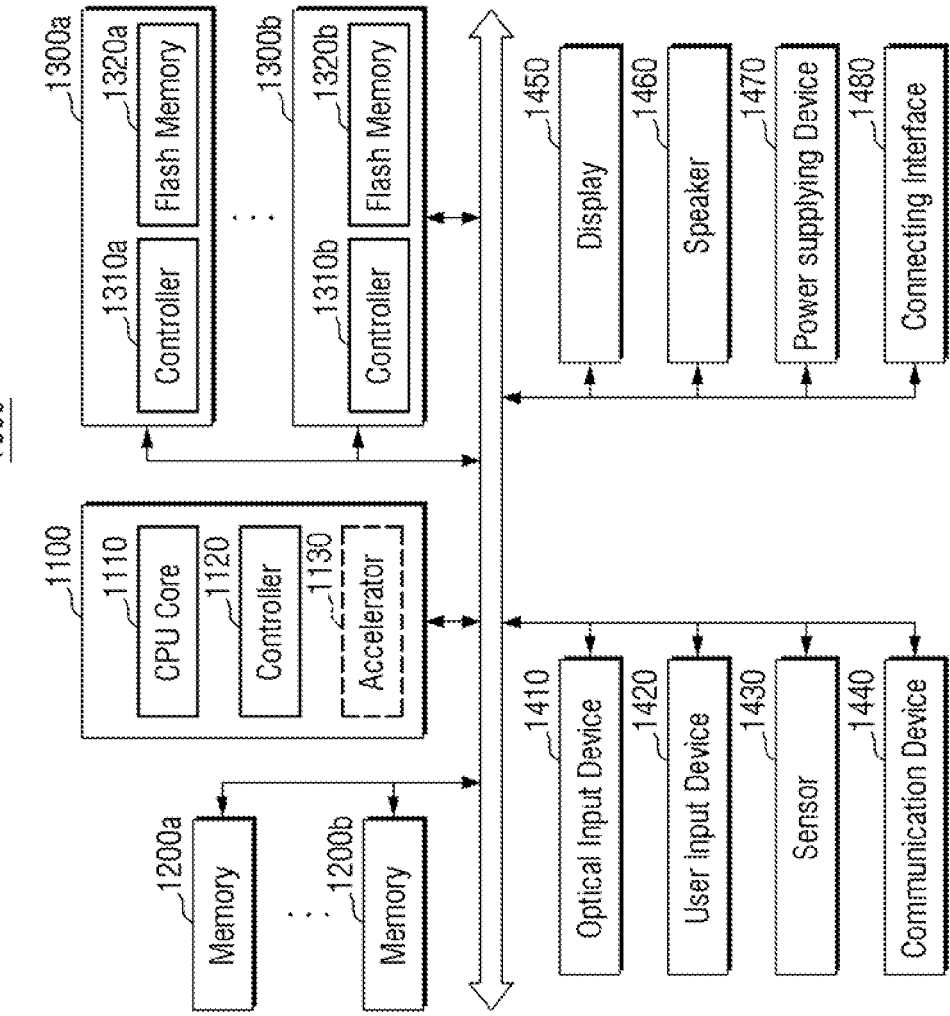
FIG. 16 is a block diagram showing a system including a non-volatile memory device according to some embodiments of the present disclosure.

FIG. 16 is a block diagram for showing a system 1000 including a non-volatile memory device according to some embodiments of the present disclosure.

Referring to FIG. 16, the system 1000 may be a mobile system such as a mobile phone, a smart phone, a tablet (PC), a wearable device, a healthcare device or an internet of things (IOT) device. However, the system 1000 of FIG. 16 is not necessarily limited to a mobile system, but may be a personal computer, a laptop computer, a server, a media player or an automotive device such as a navigation device.

Referring to FIG. 16, the system 1000 may include one or more of a main processor 1100, memories 1200a . . . 1200b, and storage devices 1300a . . . 1300b, and may additionally include one or more of an image capturing device (optical input device) 1410, a user input device 1420, a sensor 1430, a communication device 1440, a display 1450, a speaker 1460, a power supplying device 1470 and a connection interface 1480. The storage devices 1300a . . . 1300b may be a non-volatile memory device (e.g., 300 of FIG. 3 or 302 of FIG. 14) according to some embodiments of the present disclosure.

The main processor 1100 may control the overall operation of the system 1000, e.g., the operations of other components that make up the system 1000. The main processor

1100 may be implemented as a general purpose processor, a dedicated processor, an application processor, or the like.

The main processor 1100 may include one or more CPU cores 1110, and may further include a controller 1120 for controlling the memories 1200a . . . 1200b and/or the storage devices 1300a . . . 1300b. According to the present embodiment, the main processor 1100 may further include an accelerator block 1130 which is a dedicated circuit for high-speed data operations such as artificial intelligence (AI) data operations. The accelerator block 1130 may include a Graphics Processing Unit (GPU), a Neural Processing Unit (NPU) and/or a Data Processing Unit (DPU), and may also be implemented as separate chips which are physically independent of other components of the main processor 1100.

The memories 1200a . . . 1200b may be used as main storage devices of the system 1000 and may include a volatile memory such as a static RAM (SRAM) and/or a dynamic RAM (DRAM), but may also include a non-volatile memory such as a flash memory, a PRAM and/or a RRAM. The memories 1200a . . . 1200b can also be implemented in the same package as the main processor 1100.

The storage devices 1300a . . . 1300b may function as non-volatile storage devices for storing data regardless of a power supply, and may have a relatively greater storage capacity than the memories 1200a . . . 1200b. The storage devices 1300a . . . 1300b may include storage controllers 1310a . . . 1310b, and non-volatile memory (NVM) storages 1320a . . . 1320b that store data under the control of the storage controllers 1310a . . . 1310b. The non-volatile storages 1320a . . . 1320b may include a V-NAND flash memory of a 2D (2-dimensional) structure or a 3D (3-dimensional structure), but may also include a non-volatile memory of other types such as a PRAM and/or a RRAM.

The storage devices 1300a . . . 1300b may be included in the system 1000 in the state of being physically separated from the main processor 1100, and may also be implemented in the same package as the main processor 1100. In addition, the storage devices 1300a . . . 1300b may be coupled with other components of the system 1000 in an attachable and detachable manner through an interface such as a connection interface 1480, by having a shape like a memory card. Although such storage devices 1300a . . . 1300b may be devices to which standard conventions such as a universal flash storage (UFS) are applied, the present disclosure is not necessarily limited thereto.

The image capturing device 1410 may capture still images and moving images, and may be a camera, a camcorder and/or a webcam.

The user input device 1420 may receive various types of data which are input from users of the system 1000, and may be a touch pad, a keypad, a keyboard, a mouse and/or a microphone.

The sensor 1430 may detect various types of physical quantities that may be acquired from the outside of the system 1000 and convert the detected physical quantities into electrical signals. The sensor 1430 may be a temperature sensor, a pressure sensor, an illuminance sensor, a position sensor, an acceleration sensor, a biosensor and/or a gyroscope.

The communication device 1440 may send and receive signals to and from other devices outside the system 1000 according to various communication protocols. The communication device 1440 may be implemented to include an antenna, a transceiver and/or a modem.

The display 1450 and speaker 1460 may function as output devices that output visual and auditory information to the user of the system 1000, respectively.

The power supplying device 1470 may appropriately convert the power supplied from a battery built in the system 1000 and/or an external power supply and supply the power to each component of the system 1000.

The connection interface 1480 may provide a connection between the system 1000 and an external device that is connected to the system 1000 and may send and receive data to and from the system 1000. The connection interface 1480 may be implemented as various interface ways such as an Advanced Technology Attachment (ATA), a Serial ATA (SATA), an external SATA (e-SATA), a Small Computer Small Interface (SCSI), a Serial Attached SCSI (SAS), a Peripheral Component Interconnection (PCI), a PCI express (PCIe), an NVM express (NVMe), an IEEE 1394, a universal serial bus (USB), a secure digital (SD) card, a multi-media card (MMC), an embedded multi-media card (eMMC), a UFS, an embedded Universal Flash Storage (eUFS) and a compact flash (CF) card interface.

Figure 17:
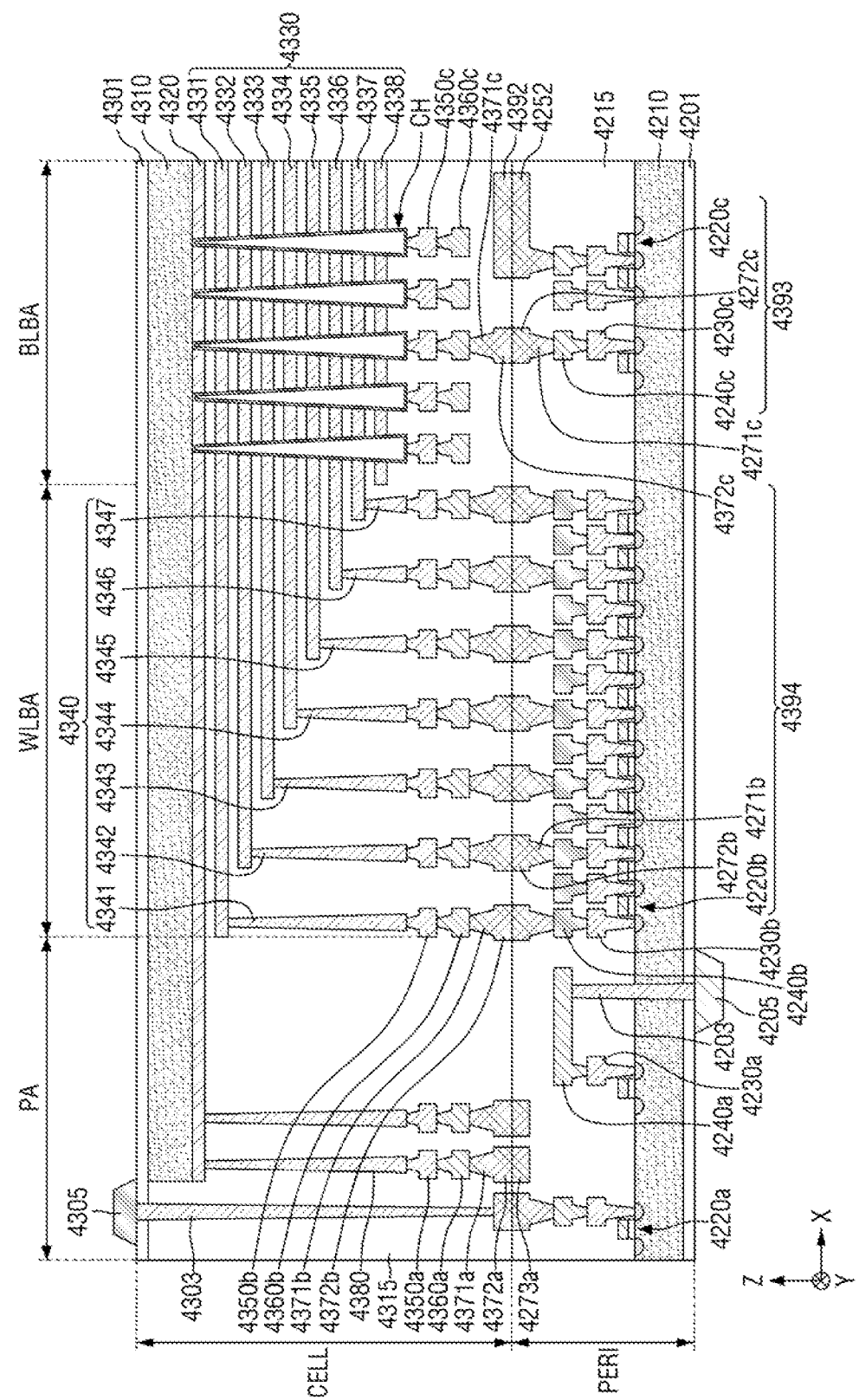
FIG. 17 is a diagram for explaining a VNAND structure included in the non-volatile memory block of the non-volatile memory device according to some embodiments of the present disclosure.

FIG. 17 is a diagram for explaining a VNAND structure included in the non-volatile memory block of the non-volatile memory device according to some embodiments of the present disclosure.

Referring to FIG. 17, a memory device 4000 included in the non-volatile memory block of the non-volatile memory device according to some embodiments of the present disclosure may have a chip to chip (C2C) structure. The C2C structure may be a structure in which an upper chip including a cell region CELL is manufactured on a first wafer, a lower chip including a peripheral circuit region PERI is manufactured on a second wafer different from the first wafer, and thereafter, the upper chip and the lower chip are connected to each other by a bonding way. As an example, the bonding way may be a technique of electrically connecting a bonding metal formed on the uppermost metal layer of the upper chip and a bonding metal formed on the uppermost metal layer of the lower chip to each other. For example, when the bonding metal is formed of copper (Cu), the bonding way may be a Cu—Cu bonding way, and the bonding metal may also be formed of aluminum or tungsten.

Each of the peripheral circuit region PERI and the cell region CELL of the memory device 4000 may include an external pad bonding region PA, a word line bonding region WLBA, and a bit line bonding region BLBA.

The peripheral circuit region PERI may include a first substrate 4210, an interlayer insulating layer 4215, a plurality of circuit elements 4220a, 4220b and 4220c formed on the first substrate 4210, first metal layers 4230a, 4230b and 4230c connected to each of the plurality of circuit elements 4220a, 4220b and 4220c, and second metal layers 4240a, 4240b and 4240c formed on the first metal layers 4230a, 4230b and 4230c. In an embodiment of the present disclosure, the first metal layers 4230a, 4230b and 4230c may be formed of tungsten which has a relatively high resistance, and the second metal layers 4240a, 4240b and 4240c may be formed of copper which has a relatively low resistance.

Although only the first metal layers 4230a, 4230b and 4230c and the second metal layers 4240a, 4240b and 4240c are shown and explained in the present specification, the present disclosure is not limited thereto, and at least one or more metal layers may be further formed on the second metal layers 4240a, 4240b and 4240c. At least a part of one or more metal layers formed over the second metal layers 4240a, 4240b and 4240c may be formed of aluminum or the like which has a lower resistance than the copper forming the second metal layers 4240a, 4240b and 4240c.

The interlayer insulating layer 4215 is placed on the first substrate 4210 to cover the plurality of circuit elements 4220a, 4220b and 4220c, the first metal layers 4230a, 4230b and 4230c, and the second metal layers 4240a, 4240b and 4240c, and may include insulation materials such as silicon oxides and silicon nitrides.

Lower bonding metals 4271b and 4272b may be formed on the second metal layer 4240b of the word line bonding region WLBA. In the word line bonding region WLBA, the lower bonding metals 4271b and 4272b of the peripheral circuit region PERI may be electrically connected to the upper bonding metals 4371b and 4372b of the cell region CELL by the bonding way, and the lower bonding metals 4271b and 4272b and the upper bonding metals 4371b and 4372b may be formed of aluminum, copper, tungsten, or the like.

The cell region CELL may provide at least one memory block. The cell region CELL may include a second substrate 4310 and a common source line 4320. A plurality of word lines (4331 to 4338; 4330) may be stacked on the second substrate 4310 along a direction (a Z-axis direction) perpendicular to the upper side of the second substrate 4310. String selection lines and a ground selection line may be placed above and below the word lines 4330, and a plurality of word lines 4330 may be placed between the string selection lines and the ground selection line.

In the bit line bonding region BLBA, a channel structure CH extends in the direction perpendicular to the upper side of the second substrate 4310, and may penetrate the word lines 4330, the string selection lines, and the ground selection line. The channel structure CH may include a data storage layer, a channel layer, a buried insulating layer, and the like, and the channel layer may be electrically connected to a first metal layer 4350c and a second metal layer 4360c. For example, the first metal layer 4350c may be a bit line contact, and the second metal layer 4360c may be a bit line. In an embodiment of the present disclosure, the second metal layer which may be referred to as the bit line 4360c may extend along a first direction (a Y-axis direction) parallel to the upper side of the second substrate 4310.

In FIG. 17, a region in which the channel structure CH and the bit line 4360c are placed may be referred to as a bit line bonding region BLBA. The bit line 4360c may be electrically connected to circuit elements 4220c that provide a page buffer 4393 in the peripheral circuit region PERI in the bit line bonding region BLBA. As an example, the bit line 4360c is connected to the upper bonding metals 4371c and 4372c in the peripheral circuit region PERI, and the upper bonding metals 4371c and 4372c may be connected to the lower bonding metals 4271c and 4272c connected to the circuit elements 4220c of the page buffer 4393.

In the word line bonding region WLBA, the word lines 4330 may extend along a second direction (a X-axis direction) parallel to the upper side of the second substrate 4310, and may be connected to a plurality of cell contact plugs (4341 to 4347; 4340). The word lines 4330 and the cell contact plugs 4340 are connected to each other with pads provided by extending at least a part of the word lines 4330 along a second direction with different lengths. A first metal layer 4350b and a second metal layer 4360b may be connected sequentially to the upper part of the cell contact plugs 4340 connected to the word lines 4330. The cell contact plugs 4340 may be connected to the peripheral circuit region PERI through the upper bonding metals 4371b and 4372b of the cell region CELL and the lower bonding metals 4271b and 4272b of the peripheral circuit region PERI in the word line bonding region WLBA.

The cell contact plugs 4340 may be electrically connected to circuit elements 4220b that provide a row decoder 4394 in the peripheral circuit region PERI. In an embodiment of the present disclosure, an operating voltage of the circuit elements 4220b that provide the row decoder 4394 may differ from an operating voltage of the circuit elements 4220c that provide the page buffer 4393. As an example, the operating voltage of the circuit elements 4220c that provide the page buffer 4393 may be greater than the operating voltage of the circuit elements 4220b that provide the row decoder 4394.

A common source line contact plug 4380 may be placed in the external pad bonding region PA. The common source line contact plug 4380 is formed of a conductive material such as metal, metal compound or polysilicon, and may be electrically connected to the common source line 4320. A first metal layer 4350a and a second metal layer 4360a may be stacked sequentially on the upper part of the common source line contact plug 4380. As an example, the region in which the common source line contact plug 4380, the first metal layer 4350a, and the second metal layer 4360a are placed may be referred to as an external pad bonding region PA.

I/O pads 4205 and 4305 may be placed in the external pad bonding region PA. Referring to FIG. 17, a lower insulation film 4201 which covers the first substrate 4210 may be formed below the first substrate 4210, and the first I/O pad 4205 may be formed on the lower insulation film 4201. The first I/O pad 4205 is connected to at least one of a plurality of circuit elements 4220a, 4220b and 4220c placed in the peripheral circuit region PERI through a first I/O contact plug 4203, and may be separated from the first substrate 4210 by the lower insulation film 4201. Further, a side insulation film may be placed between the first I/O contact plug 4203 and the first substrate 4210 to electrically separate the first I/O contact plug 4203 and the first substrate 4210.

Referring to FIG. 17, an upper insulation film 4301 which covers the upper side of the second substrate 4310 may be formed over the second substrate 4310, and the second I/O pad 4305 may be placed on the upper insulation film 4301. The second I/O pad 4305 may be connected to at least one of the plurality of circuit elements 4220a, 4220b and 4220c placed in the peripheral circuit region PERI through a second I/O contact plug 4303.

According to the embodiments of the present disclosure, the second substrate 4310 and the common source line 4320 may not be placed in the region in which the second I/O contact plug 4303 is placed. In addition, the second I/O pad 4305 may not overlap the word lines 4380 in the third direction (a Z-axis direction). Referring to FIG. 17, the second I/O contact plug 4303 is separated from the second substrate 4310 in a direction parallel to the upper side of the second substrate 4310, and may be connected to the second I/O pad 4305 by penetrating an intermediate insulating layer 4315 of the cell region CELL.

According to the embodiments of the present disclosure, the first I/O pad 4205 and the second I/O pad 4305 may be selectively formed. As an example, the memory device 4000 may include only the first I/O pad 4205 placed over the first substrate 4201 or may include only the second I/O pad 4305 placed over the second substrate 4301. Or, the memory device 4000 may include both the first I/O pad 4205 and the second I/O pad 4305.

A metal pattern of the uppermost metal layer exists as a dummy pattern in each of the external pad bonding region PA and the bit line bonding region BLBA included in each of the cell region CELL and the peripheral circuit region PERI, or the uppermost metal layer may be omitted.

The memory device 4000 may form a lower metal pattern 4273a having the same shape as the upper metal pattern 4372a of the cell region CELL on the uppermost metal layer of the peripheral circuit region PERI to correspond to the upper metal pattern 4372a formed on the uppermost metal layer of the cell region CELL, in the outer pad bonding region PA. The lower metal pattern 4273a formed on the uppermost metal layer of the peripheral circuit region PERI may not be connected to another contact in the peripheral circuit region PERI. Similarly, an upper metal pattern having the same shape as the lower metal pattern of the peripheral circuit region PERI may be formed on the upper metal layer of the cell region CELL to correspond to the lower metal pattern formed on the uppermost metal layer of the peripheral circuit region PERI in the external pad bonding region PA.

The lower bonding metals 4271b and 4272b may be formed on the second metal layer 4240b of the word line bonding region WLBA. In the word line bonding region WLBA, the lower bonding metals 4271b and 4272b of the peripheral circuit region PERI may be electrically connected to the upper bonding metals 4371b and 4372b of the cell region CELL by the bonding way.

Further, in the bit line bonding region BLBA, an upper metal pattern 4392 having the same shape as the lower metal pattern 4252 of the peripheral circuit region PERI may be formed on the uppermost metal layer of the cell region CELL to correspond to the lower metal pattern 4252 formed on the uppermost metal layer of the peripheral circuit region PERI. No contact may be formed on the upper metal pattern 4392 formed on the uppermost metal layer of the cell region CELL.

While the present disclosure has been described with reference to embodiments thereof, it will be understood by those of ordinary skill in the art that various changes in form and details may be made thereto without departing from the spirit and scope of the present disclosure as set forth by the following claims.

What is claimed is:

1. A non-volatile memory device, comprising:
   a memory cell array including non-volatile memory blocks connected to a plurality of word lines, a plurality of bit lines and a common source line;
   a common source line driver configured to supply a common source line voltage to the common source line;
   a page buffer unit configured to supply a bit line voltage to at least one of the plurality of bit lines;
   a control logic circuit configured to adjust the common source line voltage and the bit line voltage; and
   a channel initialization circuit,
   wherein the channel initialization circuit sets the common source line voltage and the bit line voltage to an initialization pulse, and
   the channel initialization circuit applies the initialization pulse between a plurality of read sections in which a read voltage is applied to at least two of the plurality of word lines,
   wherein the initialization pulse is applied at a time point when a first application of the read voltage ends and application of the initialization pulse ends at a time point when a second application of the read voltage starts.

2. The non-volatile memory device of claim 1, wherein the channel initialization circuit includes a detector configured to detect noise in the plurality of word lines before the read voltage is applied, and a pulse generator configured to set the common source line voltage and the bit line voltage to the initialization pulse.

3. The non-volatile memory device of claim 2, wherein the detector sends an initialization pulse generation signal to the pulse generator when the noise is detected.

4. The non-volatile memory device of claim 3, wherein the pulse generator receives the initialization pulse generation signal, and sets the common source line voltage and the bit line voltage to the initialization pulse.

5. The non-volatile memory device of claim 1, wherein the channel initialization circuit is disposed inside or outside the control logic circuit.

6. The non-volatile memory device of claim 1, wherein the channel initialization circuit applies the initialization pulse to the common source line and the at least one bit line during a section between the plurality of read sections, and increases a potential of a channel connected between the common source line and the at least one bit line to an initialization voltage.

7. The non-volatile memory device of claim 6, wherein the initialization voltage is 0 V.

8. A non-volatile memory device, comprising:
   a memory cell array including non-volatile memory blocks connected to a plurality of word lines, a plurality of bit lines and a common source line;
   a control logic circuit configured to adjust a voltage applied to the plurality of word lines; and
   a channel initialization circuit configured to adjust a voltage applied to the plurality of bit lines and the common source line,
   wherein the control logic circuit applies a pre-charge voltage to the word lines, on which a read operation is executed, among the plurality of word lines from a first time to a second time, applies a read voltage to the word lines on which the read operation is executed from the second time to a third time, applies the read voltage to the word lines, on which no read operation is executed, among the plurality of word lines from the first time to the third time, and executes a recovery operation on the plurality of word lines from the third time to a fourth time, and
   the channel initialization circuit applies an initialization pulse to at least one of the plurality of bit lines and the common source line during at least a period of time between the third time and the fourth time.

9. The non-volatile memory device of claim 8, wherein the initialization pulse applied at the third time.

10. The non-volatile memory device of claim 8, wherein application the initialization pulse ends at the fourth time.

11. The non-volatile memory device of claim 8, wherein the channel initialization circuit includes a detector configured to detect noise occurring in the plurality of word lines before the first time, and a pulse generator configured to set the common source line voltage and the bit line voltage to the initialization pulse.

12. The non-volatile memory device of claim 11, wherein the detector sends an initialization pulse generation signal to the pulse generator when the noise is detected.

13. The non-volatile memory device of claim 12, wherein the pulse generator receives the initialization pulse generation signal, and sets the common source line voltage and the bit line voltage to the initialization pulse.

14. The non-volatile memory device of claim 8, wherein the channel initialization circuit is disposed inside or outside the control logic circuit.

15. The non-volatile memory device of claim 8, wherein the channel initialization circuit increases a potential of a channel connected between the con non source line and the at least one bit line to an initialization voltage.

16. The non-volatile memory device of claim 15, wherein the initialization voltage is 0 V.

17. A non-volatile memory device, comprising:
- a memory cell array including non-volatile memory blocks connected to a plurality of word lines, a plurality of string selection lines, a plurality of ground selection lines, a plurality of bit lines and a common source line;
- a row decoder connected to the plurality of word lines, the plurality of string selection lines and the plurality of ground selection lines;
- a common source line driver connected to the common source line;
- a voltage generator configured to apply a word line voltage to the row decoder;
- a page buffer unit connected to the plurality of hit lines; and
- a control logic circuit configured to transfer a voltage control signal for adjusting the word line voltage to the voltage generator, transfer a row address signal including word line information, which identifies the word line to which the word line voltage is applied, to the row decoder, transfer a common source line voltage control signal, which is used to control a common source line voltage applied to the common source line, to the common source line driver, transfer a read voltage to be applied to at least two of the plurality of word lines, and transfer a column address signal including bit line information, which identifies the bit line to which a bit line voltage is to be applied, to the page buffer unit, wherein the control logic circuit includes a channel initialization circuit, the channel initialization circuit sets the common source line voltage and the bit line voltage to an initialization pulse, and the channel initialization circuit applies the initialization pulse between a plurality of read sections at which the read voltage is applied to the at least two word lines, wherein the initialization pulse is applied at a time point when application of the read voltage ends.

* * * * *